United States Patent
Miura et al.

(10) Patent No.: US 9,131,633 B2
(45) Date of Patent: Sep. 8, 2015

(54) DISPLAY DEVICE AND METHOD FOR MANUFACTURING SAME

(75) Inventors: Kentaro Miura, Kanagawa-ken (JP); Hajime Yamaguchi, Kanagawa-ken (JP); Masao Tanaka, Kanagawa-ken (JP); Takashi Miyazaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 847 days.

(21) Appl. No.: 12/511,426

(22) Filed: Jul. 29, 2009

(65) Prior Publication Data

US 2010/0026952 A1 Feb. 4, 2010

(30) Foreign Application Priority Data

Jul. 30, 2008 (JP) .................. 2008-196802

(51) Int. Cl.
*G02F 1/1345* (2006.01)
*H05K 3/36* (2006.01)
*G02F 1/1333* (2006.01)

(52) U.S. Cl.
CPC .............. *H05K 3/361* (2013.01); *G02F 1/1345* (2013.01); *G02F 1/13452* (2013.01); *G02F 1/133305* (2013.01); *G02F 1/13454* (2013.01); *H05K 2201/09109* (2013.01); *H05K 2203/1572* (2013.01)

(58) Field of Classification Search
CPC .............. G02F 1/1345; G02F 1/13452; G02F 1/13454; G02F 1/13458
USPC ................................. 349/149–152
See application file for complete search history.

(56) References Cited

U.S. PATENT DOCUMENTS

| | | | | |
|---|---|---|---|---|
| 7,092,050 | B2* | 8/2006 | Hanakawa et al. | 349/111 |
| 8,334,961 | B2* | 12/2012 | Montbach et al. | 349/149 |
| 2004/0046909 | A1* | 3/2004 | Sekiguchi | 349/113 |
| 2009/0115942 | A1* | 5/2009 | Watanabe | 349/96 |
| 2010/0039603 | A1* | 2/2010 | Chen et al. | 349/150 |

FOREIGN PATENT DOCUMENTS

| | | |
|---|---|---|
| JP | 63-174327 U | 11/1988 |
| JP | 4-39625 | 2/1992 |
| JP | 6-281941 | 10/1994 |

(Continued)

OTHER PUBLICATIONS

Notification of Reason(s) for Refusal issued Jun. 21, 2012 in Japanese Patent Application No. 2008-196802 (with English translation).

(Continued)

*Primary Examiner* — Dung Nguyen
(74) *Attorney, Agent, or Firm* — Oblon, McClelland, Maier & Neustadt, L.L.P.

(57) ABSTRACT

A display device includes: a flexible first substrate; a flexible second substrate provided facing the first substrate; a display part; and a wiring substrate. The display part has a display component which is disposed between the first substrate and the second substrate. The display component produces at least one of an optical characteristic change and a light emission. The wiring substrate is connected to a connection pad provided on at least one of the first substrate and the second substrate. At least a portion of the wiring substrate is interposed between the first substrate and the second substrate outside the display part.

18 Claims, 15 Drawing Sheets

(56) References Cited

FOREIGN PATENT DOCUMENTS

| | | |
|---|---|---|
| JP | 2001-345530 | 12/2001 |
| JP | 2003-280548 | 10/2003 |
| JP | 2004-4753 | 1/2004 |

OTHER PUBLICATIONS

Notification of Reason(s) for Refusal issued Oct. 3, 2012, in Japanese Patent Application No. 2008-196802 filed Jul. 30, 2008 (with English Translation).

* cited by examiner

DISPLAY DEVICE AND METHOD FOR MANUFACTURING SAME

CROSS-REFERENCE TO RELATED APPLICATIONS

This application is based upon and claims the benefit of priority from the prior Japanese Patent Application No. 2008-196802, filed on Jul. 30, 2008; the entire contents of which are incorporated herein by reference.

BACKGROUND OF THE INVENTION

1. Field of the Invention

This invention relates to a display device and a method for manufacturing the same.

2. Background Art

In recent years, display devices using thin film transistors (TFTS) are used widely as monitors for personal computers and display devices for information terminals such as mobile telephones due to good display quality and video image display capabilities.

Recently, development is advancing for flexible display devices that provide pliability to the display device itself to further increase the degrees of freedom of configurations (for example, JP-A 2003-280548 (Kokai)).

However, such flexible display devices suffer from the problem that separation of connection portions easily occurs during bending because the bending elastic modulus and thickness differ between the flexible printed circuit board for wiring connections and the flexible substrates on either side of the display part.

SUMMARY OF THE INVENTION

According to an aspect of the invention, there is provided a display device including: a flexible first substrate; a flexible second substrate provided facing the first substrate; a display part having a display component disposed between the first substrate and the second substrate, the display component producing at least one of an optical characteristic change and a light emission; and a wiring substrate connected to a connection pad provided on at least one of the first substrate and the second substrate, at least a portion of the wiring substrate being interposed between the first substrate and the second substrate outside the display part.

According to another aspect of the invention, there is provided a method for manufacturing a display device, the device including: a flexible first substrate; a flexible second substrate provided facing the first substrate; a display part having a display component disposed between the first substrate and the second substrate, the display component producing at least one of an optical characteristic change and a light emission; and a wiring substrate connected to a connection pad provided on at least one of the first substrate and the second substrate outside the display part, the method including: disposing the first substrate and the second substrate to face each other; and inserting at least a portion of the wiring substrate between the first substrate and the second substrate and fixing the wiring substrate to at least one of the first substrate and the second substrate.

DETAILED DESCRIPTION OF THE INVENTION

Description of the Preferred Embodiments

Figure 1:
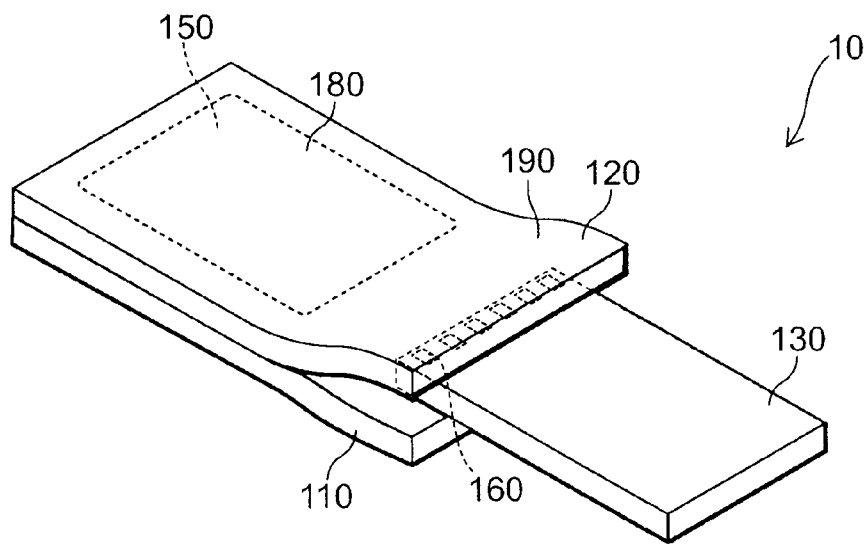
FIG. 1 is a schematic perspective view illustrating the configuration of a display device according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 2A:
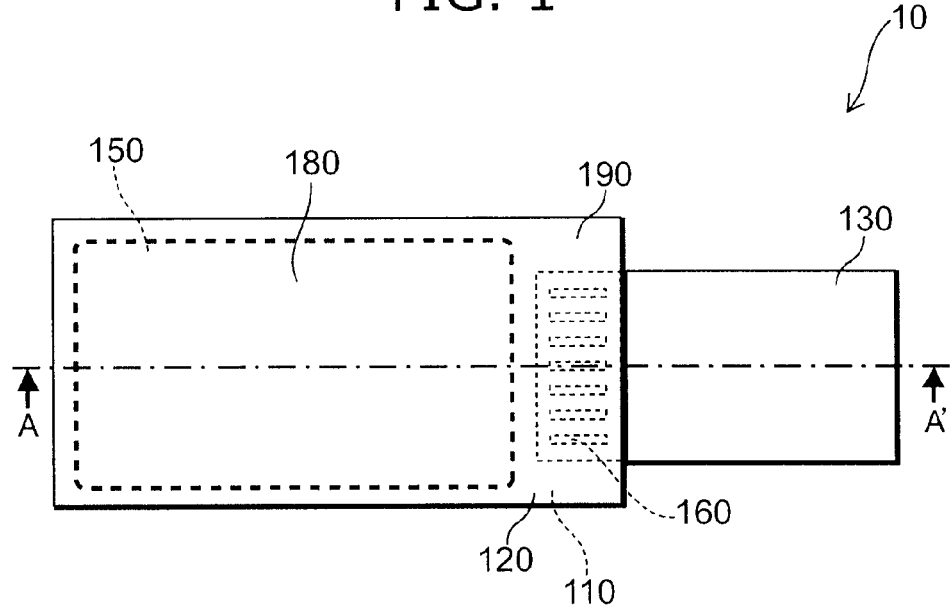
FIGS. 2A and 2B are schematic views illustrating the configuration of the display device according to the first embodiment of the invention.
Figure 2B:
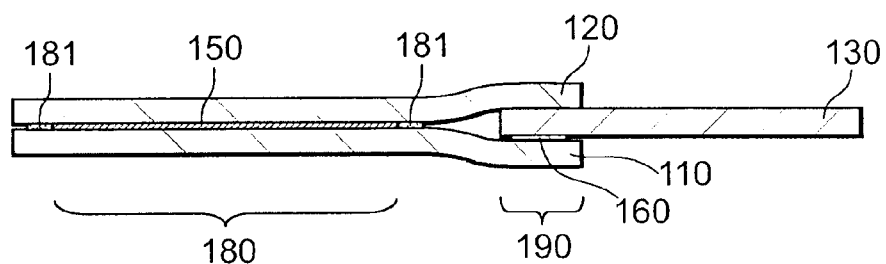

FIG. 1 is a schematic perspective view illustrating the configuration of a display device according to a first embodiment of the invention. FIGS. 2A and 2B are schematic views illustrating the configuration of the display device according to the first embodiment of the invention.

Namely, FIG. 2A is a plan view, and FIG. 2B is a cross-sectional view along line A-A' of FIG. 2A.

As illustrated in FIG. 1 to FIG. 2B, a display device 10 according to the first embodiment of the invention includes a flexible first substrate 110 and a flexible second substrate 120 provided facing the first substrate 110.

In the case where the display device 10 is an active matrix display device, for example, multiple thin film transistors (TFTs) disposed in a matrix configuration and pixel electrodes connecting thereto are provided on the first substrate 110. Thus, a display part 180 includes a region in which the pixel electrodes are provided.

In the case where the display device 10 is a passive matrix display device, multiple band-shaped first electrodes are provided on the first substrate 110, and multiple band-shaped second electrodes are provided on the second substrate 120 facing the first substrate 110. The second electrodes are aligned, for example, in a direction orthogonal to the first electrodes. In such a case, the display part 180 includes a region in which the first electrodes and the second electrodes intersect. In other words, in such a case, the display part 180 may be defined on the first substrate 110 to correspond to the second electrodes provided on the second substrate 120. Also in such a case, the display part 180 may be defined on the first substrate 110.

Hereinbelow, the case is described in which the display device 10 is assumed to be an active matrix display device.

In the display device 10, a display component 150 is provided in the display part 180 between the first substrate 110 and the second substrate 120 to produce at least one of an optical characteristic change and a light emission. For example, a liquid crystal, organic EL, etc., may be used as the display component 150. In other words, in the case where a liquid crystal is used as the display component 150, a molecular orientation of the liquid crystal changes and optical characteristics such as the refractive index, optical activity, scattering properties, etc., change based on a provided electrical signal. Also, the absorptance changes in the case where, for example, a dichroic dye is added to the liquid crystal. On the other hand, light emission occurs in the case where, for example, an organic EL is used as the display component 150.

The display device 10 according to this embodiment includes a wiring substrate 130. At least a portion of the wiring substrate 130 is interposed between the first substrate 110 and the second substrate 120 outside the display part 180 in, for example, a connection region 190.

Wiring, not illustrated, is provided on the wiring substrate 130. The wiring substrate 130 connects to a connection pad 160 provided on at least one of the first substrate 110 and the second substrate 120. In the specific example illustrated in FIGS. 2A and 2B, connection pads 160 are provided in the connection region 190 outside the display part 180 of the first substrate 110. In other words, the wiring of the wiring substrate 130 electrically connects to the connection pads 160 provided on the first substrate 110. However, it is sufficient that the wiring substrate 130 connects to the connection pads 160 provided on at least one of the first substrate 110 and the second substrate 120.

Thus, the display device 10 according to this embodiment includes: a flexible first substrate 110; a flexible second substrate 120 provided facing the first substrate 110; a display component 150 provided between the first substrate 110 and the second substrate 120 in the display part 180 to produce at least one of an optical characteristic change and a light emission; and a wiring substrate 130 provided outside the display part 180 such that at least a portion of the wiring substrate 130 is interposed between the first substrate 110 and the second substrate 120 to connect to a connection pad 160 provided on at least one of the first substrate 110 and the second substrate 120.

In the display device 10 according to this embodiment having such a configuration, the wiring substrate 130 is fixed between both the first substrate 110 and the second substrate 120. Even in the case where, for example, the wiring substrate 130 tends to lift upward from the first substrate 110, the second substrate 120 presses the wiring substrate 130 and suppresses such lifting. Therefore, the wiring substrate 130 and the first substrate 110 are securely bonded, and the wiring substrate 130 does not easily separate from the first substrate 110. Thereby, the wiring of the wiring substrate 130 is stably connected to the connection pads 160 of the first substrate 110.

As illustrated in FIG. 1 to FIG. 2B, for example, a bonding layer 181 is provided between the first substrate 110 and the second substrate 120 outside the display part 180 to fixedly bond the first substrate 110 and the second substrate 120. The first substrate 110 and the second substrate 120 are fixed by the bonding layer 181, and therefore the wiring substrate 130 is strongly fixed by the first substrate 110 and the second substrate 120 to at least one of the first substrate 110 and the second substrate 120.

Although the bonding layer 181 is provided to surround the display part 180 in the specific example illustrated in FIG. 2B, the invention is not limited thereto. The bonding layer 181 may be provided intermittently outside the display part 180, and it is sufficient that the bonding layer 181 fixes the first substrate 110 and the second substrate 120.

Comparative Example

Figure 3:
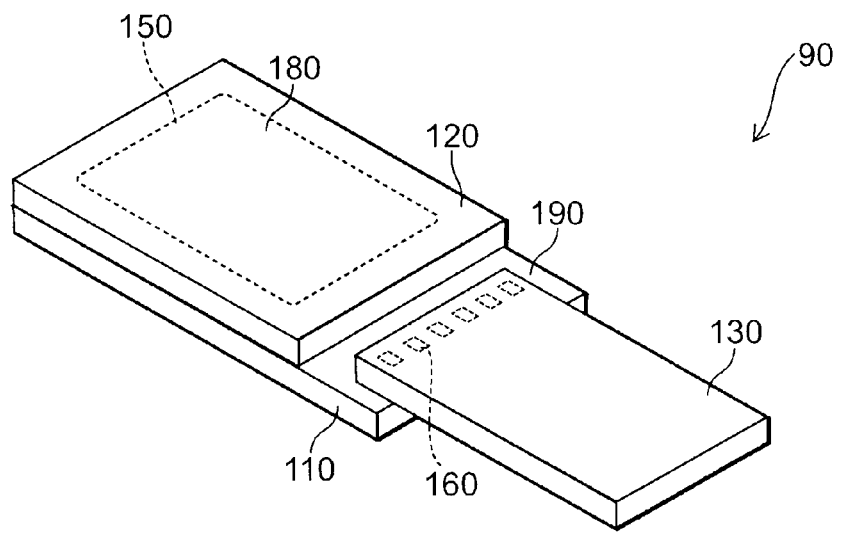
FIG. 3 is a schematic perspective view illustrating the configuration of a display device of a comparative example.

FIG. 3 is a schematic perspective view illustrating the configuration of a display device of a comparative example.

Figure 4A:
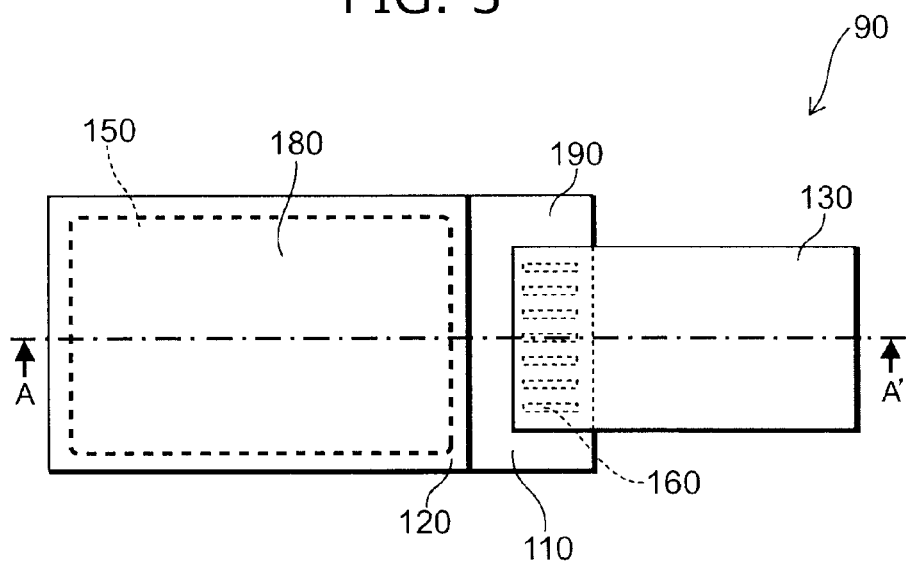
FIGS. 4A and 4B are schematic views illustrating the configuration of the display device of the comparative example.
Figure 4B:
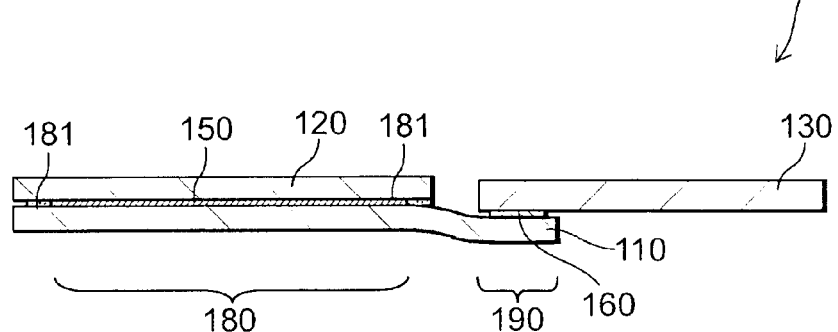

FIGS. 4A and 4B are schematic views illustrating the configuration of the display device of the comparative example.

Namely, FIG. 4A is a plan view, and FIG. 4B is a cross-sectional view along line A-A' of FIG. 4A.

As illustrated in FIG. 3 to FIG. 4B, a display device 90 of the comparative example also includes a flexible first substrate 110 and a flexible second substrate 120 provided facing the first substrate 110.

In the case of the display device 90 of the comparative example, no portion of the wiring substrate 130 is interposed between the first substrate 110 and the second substrate 120. The wiring substrate 130 is provided to contact only the first substrate 110. Otherwise, the display device 90 may be similar to the display device 10 according to this embodiment, and a description thereof is omitted.

In the display device 90 of the comparative example, the wiring substrate 130 is not disposed between the first substrate 110 and the second substrate 120. Therefore, the mechanical strength is poor.

Figure 5A:
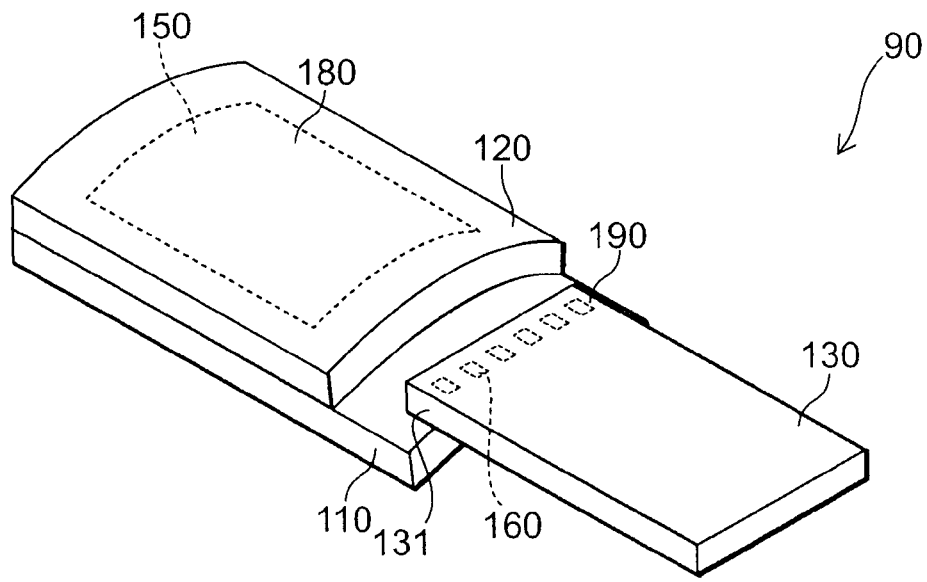
FIGS. 5A and 5B are schematic perspective views illustrating the display device of the comparative example when the display device is bent.
Figure 5B:
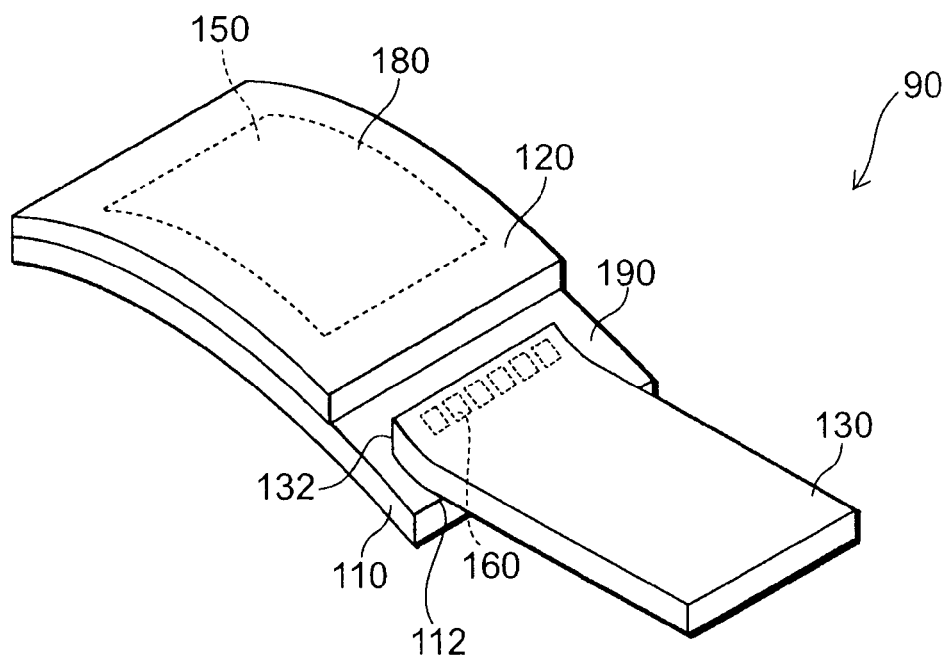

FIGS. 5A and 5B are schematic perspective views illustrating the display device of the comparative example when the display device is bent.

As illustrated in FIG. 5A, the wiring substrate 130 and the first substrate 110 easily separate at a side face 131 of the wiring substrate 130 when the display device 90 is bent in a direction perpendicular to the alignment direction of the wiring substrate 130. In other words, even in the case where the bending elastic modulus of the wiring substrate 130 is small and the configuration of the wiring substrate 130 easily deforms to follow the deformation of the first substrate 110, separation easily occurs, particularly at the side face 131 portion of the wiring substrate 130. In the case where the bending elastic modulus of the wiring substrate 130 is large, separation occurs even more easily.

On the other hand, as illustrated in FIG. 5B, the wiring substrate 130 and the first substrate 110 easily separate at an end face 132 of the wiring substrate 130 or an end face 112 of first substrate 110 on the wiring substrate 130 side when the display device 90 is bent along the alignment direction of the wiring substrate 130. In other words, even in the case where the wiring substrate 130 is soft and the configuration of the wiring substrate 130 easily deforms to follow the deformation of the first substrate 110, separation occurs easily at the end face 132 and the end face 112. In the case where the wiring substrate 130 is highly rigid, separation occurs even more easily.

Such a separation of the wiring substrate 130 and the first substrate 110 is problematic even in the initial state directly after manufacturing the display device, and is particularly problematic in the case where the bonding force between the wiring substrate 130 and the first substrate 110 declines due to change over time after use.

Display devices using flexible first and second substrates 110 and 120 are bent often during use. The separation recited above is therefore problematic. Even in the case where the display device is not bent intentionally, separation between the wiring substrate 130 and the first substrate 110 may occur due to vibrations during transportation or a shock when the display device is dropped. Thus, the wiring substrate 130 is connected only to the first substrate 110 in the display device 90 of the comparative example, and therefore the wiring substrate 130 and the first substrate 110 separate extremely easily.

Figure 6A:
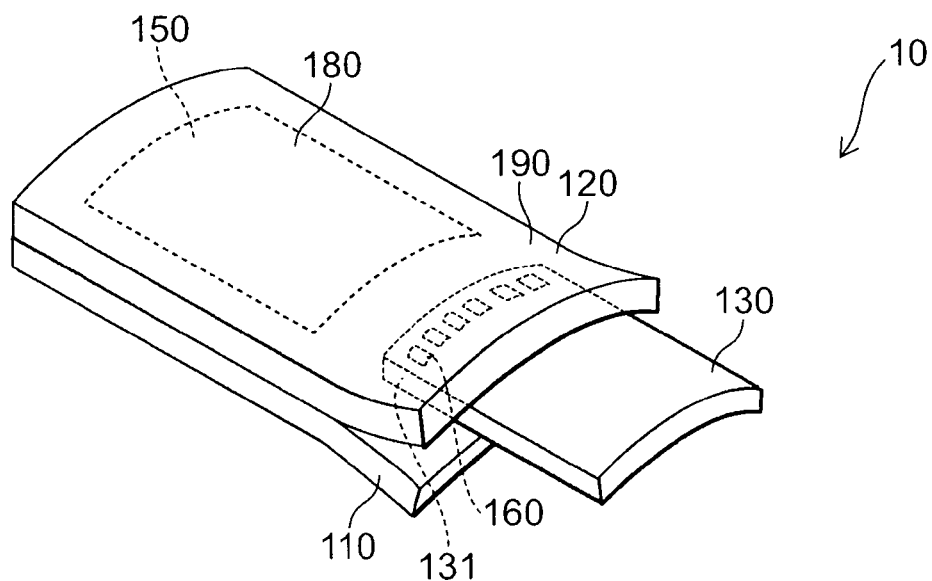
FIGS. 6A and 6B are schematic perspective views illustrating the display device according to the first embodiment of the invention when bent.
Figure 6B:
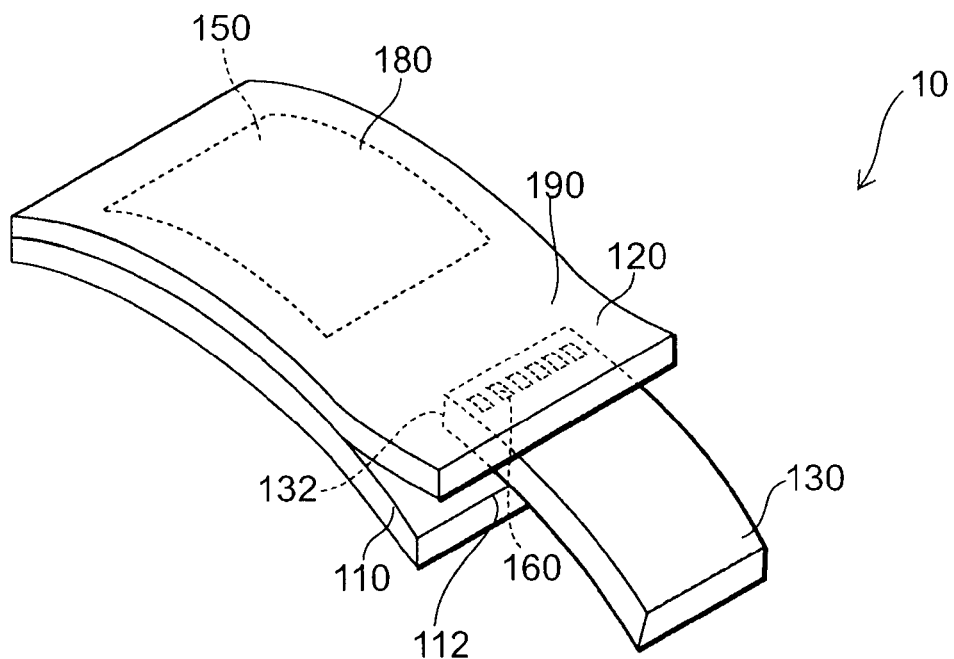

FIGS. 6A and 6B are schematic perspective views illustrating the display device according to the first embodiment of the invention when bent.

In the display device 10 according to this embodiment illustrated in FIGS. 6A and 6B, the wiring substrate 130 is disposed between the first substrate 110 and the second substrate 120 at the end portion forming the connection portion. Therefore, even when the display device 10 is bent in the direction perpendicular to the alignment direction of the wiring substrate 130 or along the alignment direction, the side face 131 and the end face 132 of the wiring substrate 130 and the end face 112 of the first substrate 110, which tend to separate most easily, do not lift easily at the end portions. Therefore, the display device 10 is extremely resistant to such bending.

In other words, substantially no separation of the wiring substrate 130 from the first substrate 110 occurs in the case where the bending elastic modulus of the wiring substrate 130 is small and the configuration of the wiring substrate 130 easily deforms to follow the deformation of the first substrate 110, and even in the case where the bending elastic modulus of the wiring substrate 130 is large.

Separation can be effectively suppressed in the initial state directly after manufacturing the display device and even in the case where the bonding force between the wiring substrate 130 and the first substrate 110 has declined due to change over time after use.

In the display device 10, separation between the wiring substrate 130 and the first substrate 110 can be effectively suppressed even in cases of intentional bending, vibrations during transportation, and shocks when the display device is dropped.

Thus, the display device 10 according to this embodiment suppresses separation of the connection portion without using a new member for suppressing separation.

As described above, the first and second substrates 110 and 120 are so-called flexible substrates including various highly transparent and highly heat-resistant resin materials, e.g., polyethersulfone, cyclic polyolefin, etc. Birefringent materials such as polyethylene terephthalate (PET), polyethylene naphthalate (PEN), and the like also may be used. A polarizer is used in the case where the display component 150 includes, for example, a liquid crystal which displays by utilizing changes in polarity and/or optical activity. Therefore, it is favorable to use a material having low birefringence as the first and second substrates 110 and 120. However, the birefringent PET and PEN recited above (having high birefringence) may be used in addition to materials of low birefringence in the case where the display component 150 displays by utilizing scattering properties and/or absorption properties. In the case where the display component 150 is reflective and/or light-emissive, it is possible to use a light-shielding material as at least one of the first and second substrates 110 and 120, e.g., an opaque or colored plastic substrate or a metal substrate such as SUS (stainless steel), etc. In other words, it is sufficient that the first and second substrates 110 and 120 are flexible and exhibit at least one of pliability and bendability.

The thickness of the first and second substrates 110 and 120 may be, for example, about 30 μm to 300 μm. The thickness is determined by the properties of the material to be used or by specifications based on applications of the display device.

Although thinner first and second substrates 110 and 120 have better pliability, it is difficult to handle thin substrates. For example, in the case where a sheet having a thickness of 100 μm or less is used, a step that forms the display device can be executed in a state in which the sheets forming the first and second substrates 110 and 120 are fixed on a substrate made of, for example, glass and the like, which does not deform easily, using an adhesive, etc.

On the other hand, various substrates may be used as the wiring substrate 130 including flexible substrates and relatively rigid substrates. For example, the wiring substrate 130 may include a flexible printed circuit board made of, for example, polyimide, polyester, and the like or a relatively rigid printed circuit board made of epoxy resin and the like. For example, in the case where the width of the portion of the wiring substrate 130 facing the connection pads 160 provided on at least one of the first and second substrates 110 and 120 is relatively small, major problems do not occur when the display device 10 is bent even in the case where the wiring substrate 130 does not bend easily. On the other hand, in the case where the width of the wiring substrate 130 is large, it is favorable to use a relatively highly-flexible material as the wiring substrate 130 such that the deformation of the wiring substrate 130 is not obstructed when the display device 10 is bent.

The wiring substrate 130 may supply various electrical signals and/or power supply current, etc., necessary for the display of the display device 10 to at least one of the first and second substrates 110 and 120 via the connection pads 160 provided on at least one of the first and second substrates 110 and 120.

Further, the wiring substrate 130 may receive various electrical signals from at least one of the first and second substrates 110 and 120 via the connection pads provided on at least one of the first and second substrates 110 and 120. In the case where a mechanism that detects, for example, light, pressure, etc., is provided on, for example, at least one of the first and second substrates 110 and 120, an electrical signal based thereon can be transmitted from the at least one of the first and second substrates 110 and 120 to the wiring substrate 130 via the connection pads provided on at least one of the first and second substrates 110 and 120.

Thus, the wiring substrate 130 performs, on the first and second substrates 110 and 120, at least one of an input and an output of at least one of various electrical signals and various power supply currents. That is, the wiring substrate 130 performs, on the first substrate 110 and the second substrate 120, at least one of an electrical signal input, an electrical signal output, a power supply current input, and a power supply current output.

In the display device 10 according to this embodiment, at least one of an optical characteristic change and a light emission of the display component 150 can be produced by an electrical signal provided to the display component 150 by an electrode provided on at least the first substrate 110.

For example, in the case where TFTs, pixel electrodes connected thereto, and a counter electrode facing the pixel electrodes are provided on the first substrate 110 and a liquid crystal is used for the display component 150, changes in the electric field produced by the pixel electrodes and the counter electrode mainly in a plane parallel to the substrate can cause changes of the orientation of the liquid crystal, and the display can be realized by extracting this change via a polarizer. For example, in the case where TFTs and pixel electrodes connected thereto are provided on the first substrate 110, the counter electrode is provided on the second substrate 120, and a liquid crystal is used for the display component 150, changes in the electric field produced by the pixel electrodes and the counter electrode in a direction perpendicular to the substrate can cause changes of the orientation of the liquid crystal, and the display can be realized by extracting this change via a polarizer. In such a case, for example, a twisted nematic mode of the liquid crystal can be used. In such a case, the counter electrode provided on the second substrate 120 may connect first to the first substrate 110 side and then connect to the wiring substrate 130 by connection pads 160 provided on the first substrate 110. Alternatively, the counter electrode provided on the second substrate 120 may connect directly to the wiring substrate 130 by connection pads 160 provided on the second substrate 120.

In the case where a light-emitting organic EL or the like is used for the display component 150, for example, TFTs provided on, for example, the first substrate 110 and electrodes connected thereto drive the display component 150.

Thus, the driving method differs by type and characteristics of the display component 150. Thereby, the method of supplying the electrical signal for displaying differs.

The electrical signal provided to the interior of the display part 180 may be different from the electrical signal supplied by the wiring substrate 130 to the connection pads 160 provided on at least one of the first and second substrates 110 and 120. For example, in the case where various drive circuits such as shift registers are provided in a peripheral portion of the display part 180, the electrical signal provided by the wiring substrate 130 to the connection pads 160 provided on at least one of the first and second substrates 110 and 120 differs from the electrical signal provided to the display component 150 of the interior of the display part 180. The electrical signal provided to the interior of the display part 180 also may be the same as the electrical signal supplied by the wiring substrate 130 to the connection pads 160 provided on at least one of the first and second substrates 110 and 120.

In the display device 10 according to this embodiment described above, a polarizer can be disposed on at least one of a side of the first substrate 110 opposite to the side facing the second substrate 120 and a side of the second substrate 120 opposite to the side facing the first substrate 110. In such a case, the polarizer can be adhered to the first and second substrates 110 and 120. In other words, in the display device 10 according to this embodiment, a polarizer can be adhered to at least one of the first and second substrates 110 and 120. Also, a polarizer may be disposed on at least one of the side of the first substrate 110 facing the second substrate 120 and the side of the second substrate 120 facing the first substrate 110.

Although one wiring substrate 130 is provided outside one side of the display part 180 in the display device 10 illustrated in FIG. 1 to FIG. 2B, the invention is not limited thereto.

Figure 7A:
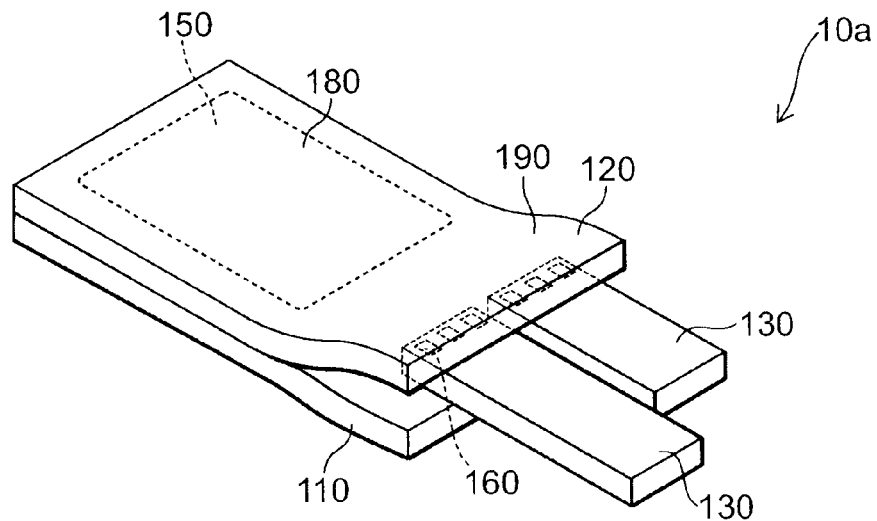
FIGS. 7A and 7B are schematic perspective views illustrating the configuration of another display device according to the first embodiment of the invention.
Figure 7B:
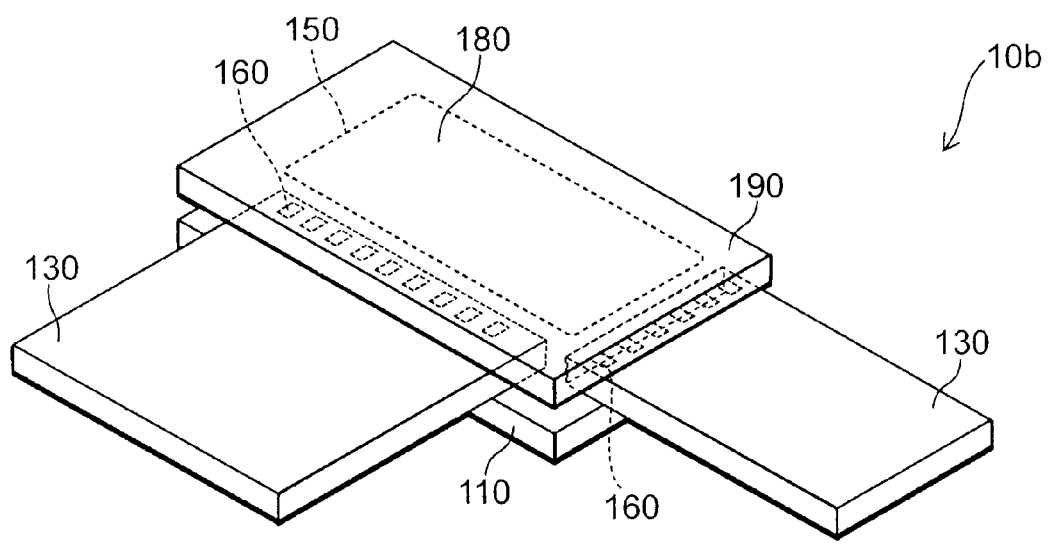

FIGS. 7A and 7B are schematic perspective views illustrating the configuration of another display device according to the first embodiment of the invention.

In another display device 10a according to this embodiment illustrated in FIG. 7A, two wiring substrates 130 are provided outside one side of the display part 180. Thus, multiple wiring substrates 130 are provided outside one side of the display part 180.

In another display device 10b according to this embodiment illustrated in FIG. 7B, one wiring substrate 130 is provided outside each of two sides of the display part 180. Thus, wiring substrates 130 can be provided outside multiple sides of the display part 180. In such a case, the number of wiring substrates 130 provided on one side may be one, two, or more.

Figure 8:
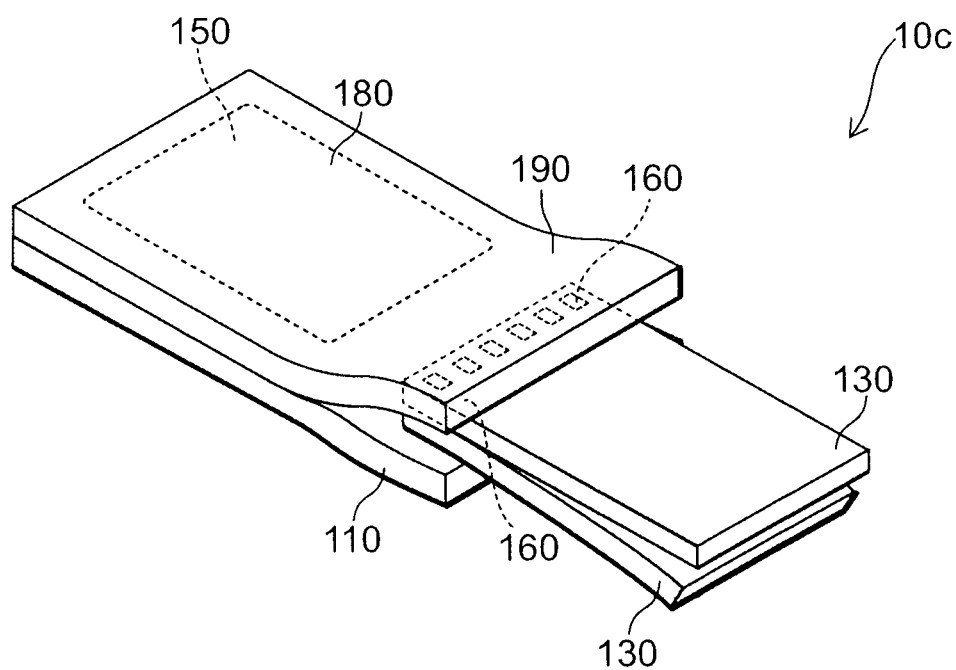
FIG. 8 is a schematic perspective view illustrating the configuration of another display device according to the first embodiment of the invention.

FIG. 8 is a schematic perspective view illustrating the configuration of another display device according to the first embodiment of the invention.

In another display device 10c according to this embodiment illustrated in FIG. 8, two wiring substrates 130 are stacked and provided outside one side of the display part 180. In other words, for example, connection pads 160 are provided on each of the first substrate 110 and the second substrate 120; two wiring substrates 130 are stacked such that each connects to the connection pads; and a portion of the wiring substrates 130 is interposed between the first and second substrates 110 and 120. Thus, multiple wiring substrates 130 can be stacked and provided outside one or multiple sides of the display part 180.

In the case where the structure of FIG. 8 is used, band-shaped electrodes of, for example, a passive matrix display device can connect to the wiring of each of the first substrate 110 and the second substrate 120.

Instead of stacking two wiring substrates 130 such as the structure of FIG. 8, a wiring substrate in which wiring is formed on both surfaces of one substrate may be used to connect to each of the first substrate 110 and the second substrate 120.

Figure 9A:
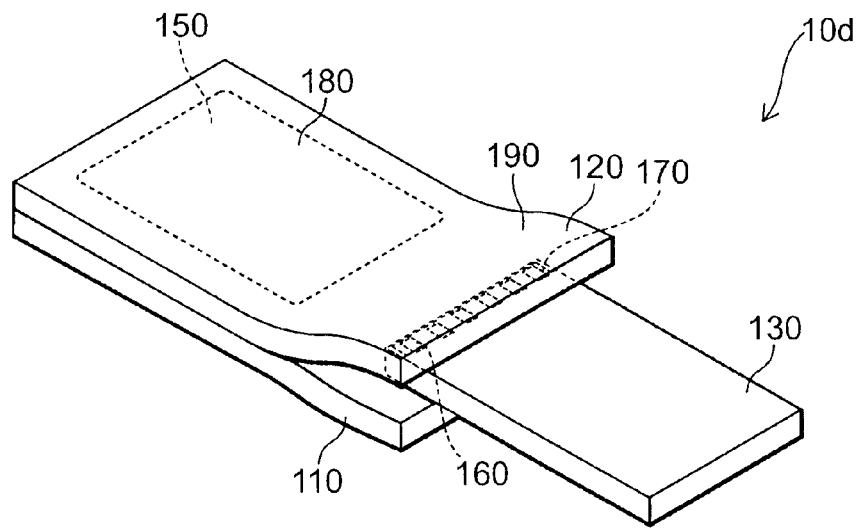
FIGS. 9A to 9C are schematic views illustrating the configuration of another display device according to the first embodiment of the invention.
Figure 9B:
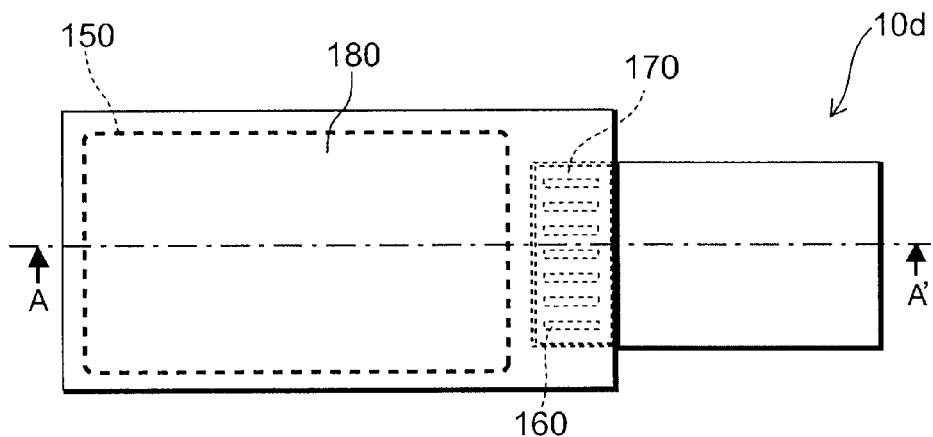
Figure 9C:
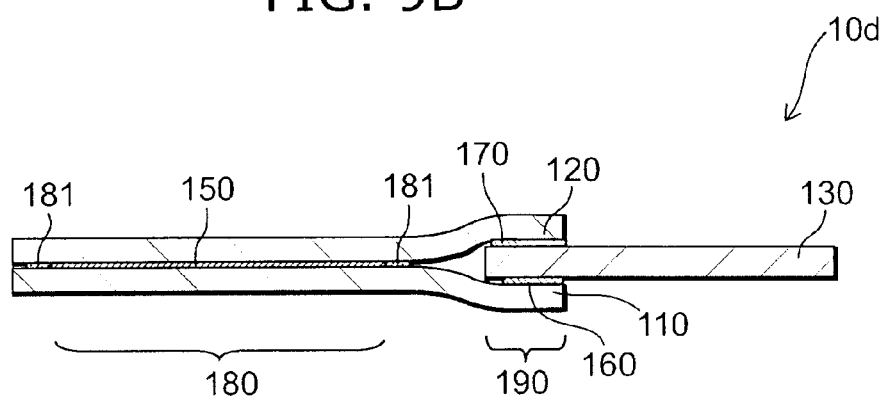

FIGS. 9A to 9C are schematic views illustrating the configuration of another display device according to the first embodiment of the invention. Namely, FIG. 9A is a schematic perspective view, FIG. 9B is a schematic plan view, and FIG. 9C is a schematic cross-sectional view.

In another display device 10d according to this embodiment illustrated in FIGS. 9A to 9C, the wiring substrate 130 connects to the first substrate 110 via the connection pads 160 and is bonded to the second substrate 120 by a bonding layer 170. The first substrate 110 and the second substrate 120 are connected by the bonding layer 170 via the wiring substrate 130 in addition to being connected by the bonding layer 181. The first and second substrates 110 and 120 thereby behave more as a single body when bent. Therefore, separation at the side face and the end face of the wiring substrate 130 can be suppressed.

Using a bonding layer 170 having a small Young's modulus can relieve stress due to bending and suppress defects such as separation of the bonding layer 181. Separation can be further suppressed by forming the bonding layer 170 also in regions between the first substrate 110 and the second substrate 120 where the wiring substrate 130 is not disposed.

Figure 10A:
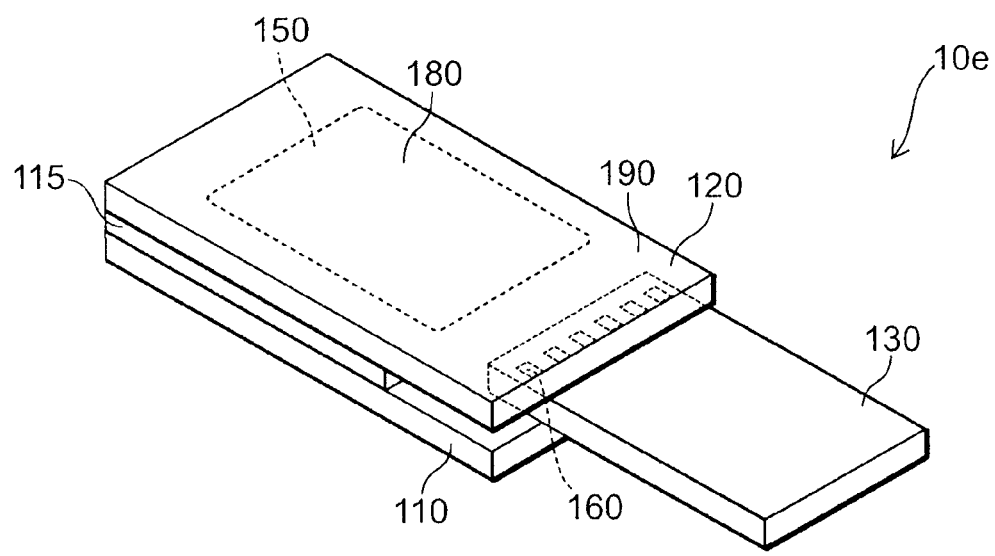
FIGS. 10A and 10B are schematic views illustrating the configuration of another display device according to the first embodiment of the invention.
Figure 10B:
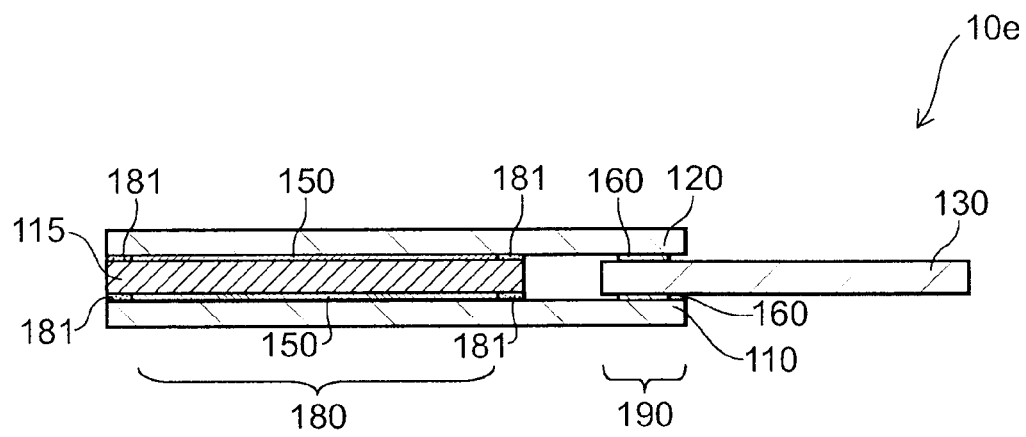

FIGS. 10A and 10B are schematic views illustrating the configuration of another display device according to the first embodiment of the invention.

Namely, FIG. 10A is a schematic perspective view, and FIG. 10B is a schematic cross-sectional view.

Another display device 10e according to this embodiment illustrated in FIGS. 10A and 10B is an example in which an insulative separation layer 115 is provided between the first substrate 110 and the second substrate 120. Display components 150 are provided, for example, between the first substrate 110 and the separation layer 115, and between the second substrate 120 and the separation layer 115. In other words, the display device 10e has a two-layer structure. For example, TFTs and pixel electrodes connected thereto are provided in a matrix configuration on each of the first substrate 110 and the second substrate 120 to drive each of the layers of the display components 150. For example, a guest-host liquid crystal, a guest-host liquid crystal and a scattering/transmission switching liquid crystal, etc., may be used as the two layers of the display components.

For the separation layer 115, a material having a similar raw material and thickness as those of the first substrate 110 and the second substrate 120 may be used; a raw material different from those of the first substrate 110 and the second substrate 120 may be used; and a material thinner than the first substrate 110 and the second substrate 120 may be used, e.g., a thin film formed by vapor deposition and the like. In other words, it is sufficient that the two layers of the display components 150 are separated by the separation layer 115. In the case where a voltage is applied between the separation layer 115 and the first substrate 110 and between the separation layer 115 and the second substrate 120, an electrode may be provided on surfaces of the separation layer 115 facing the first and second substrates 110 and 120.

Also in the display device 10e having such a structure, at least a portion of the wiring substrate 130 is interposed between the first substrate 110 and the second substrate 120 outside the display part 180 in, for example, the connection region 190. Thereby, a display device which suppresses separation of the connection portion can be provided without providing a new dedicated member for protection.

In this specific example, connection pads 160 are provided on both the first and second substrates 110 and 120 to connect to the wiring substrate 130. However, even in the case where, for example, electronic circuits of TFTs and the like are provided on both the first and second substrates 110 and 120, the electrical connection of the electronic circuits of both substrates may be first connected to one of the substrates and then connected to the wiring substrate 130.

In this specific example, depending on the characteristics of the display components 150, TFTs and pixel electrodes may be provided on both the first and second substrates 110 and 120 without providing the separation layer 115.

Furthermore, TFTs and pixel electrodes may be provided on both major surfaces of the separation layer 115, and counter electrodes may be provided on each of the first substrate 110 and the second substrate 120.

Figure 11A:
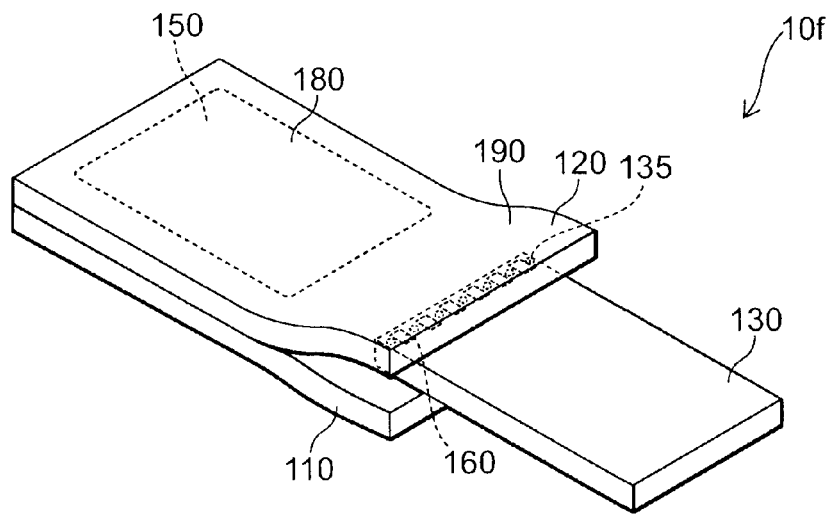
FIGS. 11A to 11C are schematic views illustrating the configuration of another display device according to the first embodiment of the invention.
Figure 11B:
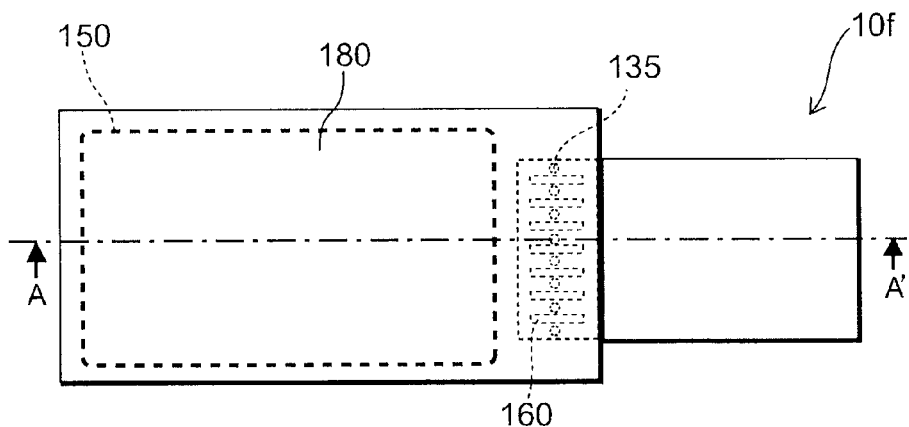
Figure 11C:
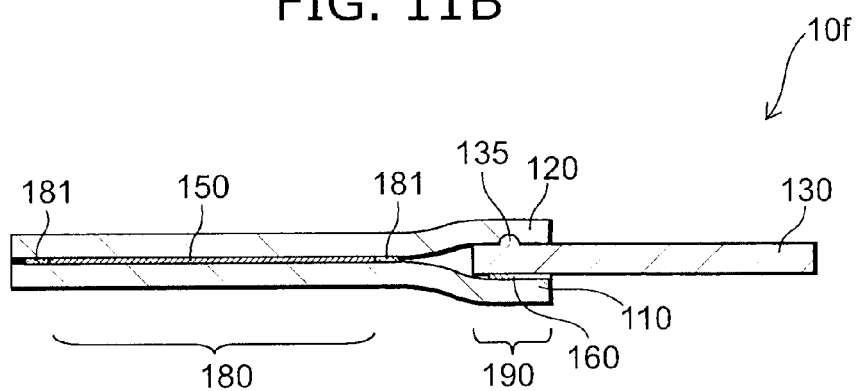

FIGS. 11A to 11C are schematic views illustrating the configuration of another display device according to the first embodiment of the invention.

Namely, FIG. 11A is a schematic perspective view, FIG. 11B is a schematic plan view, and FIG. 11C is a cross-sectional view along line A-A' of FIG. 11B.

In another display device 10f according to this embodiment illustrated in FIGS. 11A to 11C, protrusions 135 are provided in a portion of the wiring substrate 130 facing the first substrate 110. In this specific example, the protrusions 135 are sunk into the second substrate 120, that is, at least portions of the protrusions 135 are buried in the second substrate 120 to bond the wiring substrate 130 and the second substrate 120. Thereby, the bonding between the wiring substrate 130 and the second substrate 120 is made more securely.

The protrusions 135 may be formed of the material forming the wiring substrate 130, or may be formed of another material. The protrusions 135 may be formed of a resin and the like, and may be formed of, for example, various conducting films forming the wiring provided on the wiring substrate 130. In other words, it is sufficient that the protrusions 135 protrude from a major surface of the wiring substrate 130.

The protrusions 135 may be provided on a portion of the wiring substrate 130 facing at least one of the first and second substrates 110 and 120. In such a case, the protrusions 135 may be sunk into at least one of the first and second substrates 110 and 120.

A single protrusion 135 or multiple protrusions 135 may be used. In the case where, for example, the protrusions 135 are formed to face the first substrate 110, the protrusions 135 may be provided to be sunk at end portions of the connection pads 160; the protrusions 135 may be provided to be sunk between each of multiple connection pads 160; or the protrusions 135 may be formed of a conductive material to be sunk into the connection pads 160.

When sinking the protrusions 135 into at least one of the first and second substrates 110 and 120, pressure may be applied to the wiring substrate 130 and at least one of the first and second substrates 110 and 120. Heating may be performed at this time.

Thus, in the display device according to this embodiment, a protrusion 135 is provided on the wiring substrate 130. At least a portion of the protrusion 135 can be buried in at least one of the first and second substrates 110 and 120.

Such a structure not only improves resistance to separation but also to a force pulling in the wiring direction of the wiring substrate 130.

The various display devices recited above according to this embodiment having such a configuration can be manufactured, for example, by two types of methods described below.

Figure 12A:
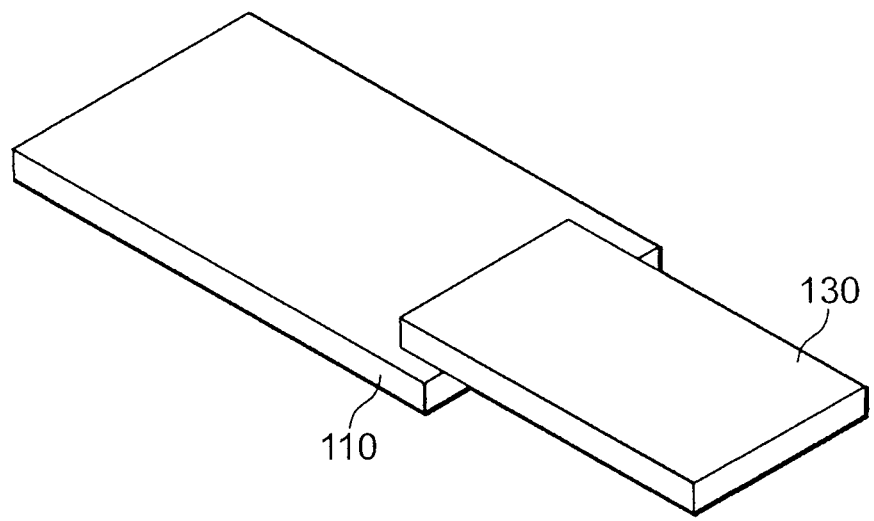
FIGS. 12A and 12B are schematic perspective views illustrating a method for manufacturing the display device according to the first embodiment of the invention.
Figure 12B:
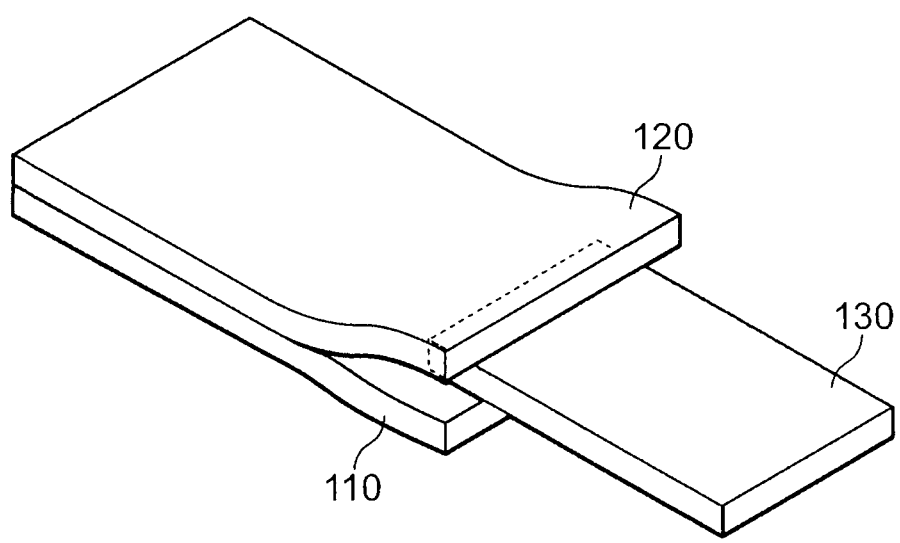

FIGS. 12A and 12B are schematic perspective views illustrating a method for manufacturing the display device according to the first embodiment of the invention.

As illustrated in FIG. 12A, first, the wiring substrate 130 is disposed on the first substrate 110.

Then, as illustrated in FIG. 12B, the first substrate 110 and the second substrate 120 are stacked, and the first substrate 110 and the second substrate 120 are adhered together.

Thus, the various display devices recited above according to this embodiment can be formed.

In such a case, e.g., the case where the connection pads 160 are provided on the first substrate 110, the electrical connection between the connection pads 160 and the wiring substrate 130 can be made when adhering the wiring substrate 130 to the first substrate 110. However, the invention is not limited thereto. The electrical connection between the wiring substrate 130 and the connection pads 160 provided on at least one of the first and the second substrates 110 and 120 can be made by at least one of the adhesion between the first substrate 110 and the wiring substrate 130 and the adhesion between the first substrate 110 and the second substrate 120.

Figure 13A:
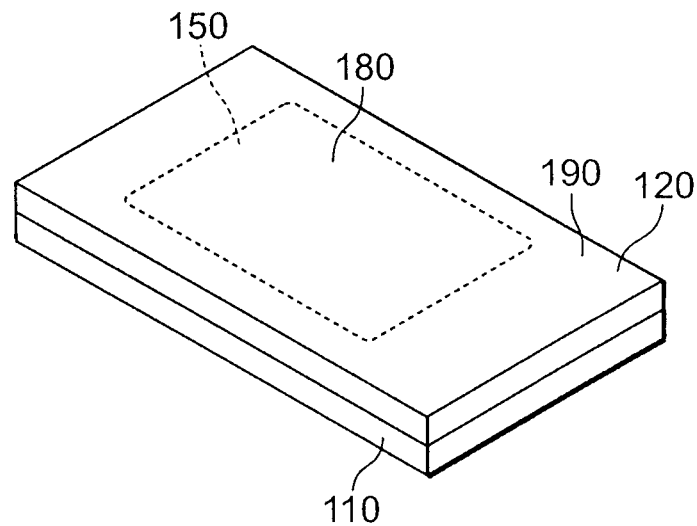
FIGS. 13A and 13B are schematic perspective views illustrating another method for manufacturing the display device according to the first embodiment of the invention.
Figure 13B:
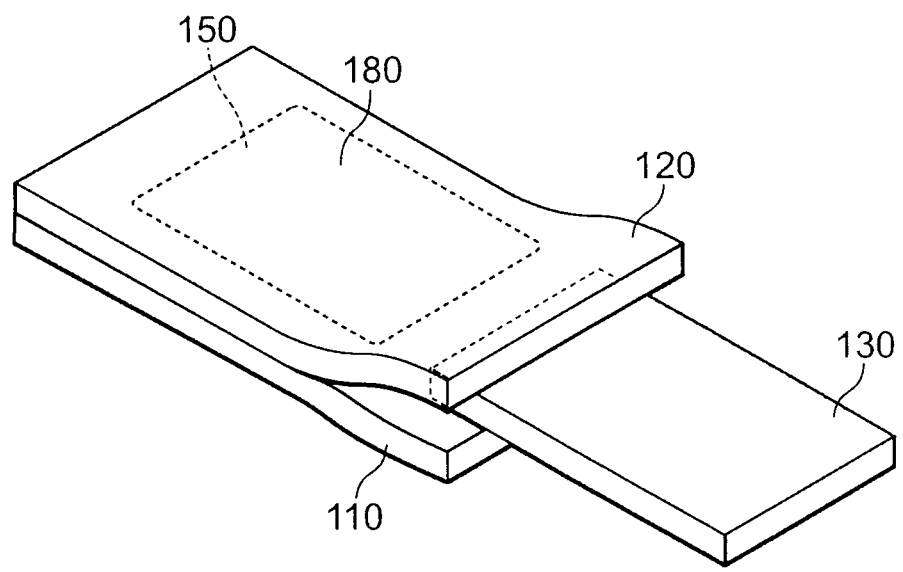

FIGS. 13A and 13B are schematic perspective views illustrating another method for manufacturing the display device according to the first embodiment of the invention.

As illustrated in FIG. 13A, first, the first substrate 110 and the second substrate 120 are disposed to face each other.

Then, as illustrated in FIG. 13B, at least a portion of the wiring substrate 130 is inserted and fixed between the first substrate 110 and the second substrate 120 outside the display part 180.

Thus, the various display devices recited above according to this embodiment can be formed.

In such a case, the electrical connection between the wiring substrate 130 and the connection pads 160 provided on at least one of the first and second substrates 110 and 120 can be made when inserting and fixing at least a portion of the wiring substrate 130 between the first substrate 110 and the second substrate 120 or thereafter.

The manufacturing method illustrated in FIGS. 13A and 13B is advantageous when manufacturing by a method that makes multiple display devices 10 from a larger sheet.

FIGS. 14A to 14D are schematic perspective views illustrating a portion of another method for manufacturing the display device according to the first embodiment of the invention.

Namely, FIGS. 14A to 14D are schematic plan views illustrating steps during manufacturing of the display device by a method that makes multiple display devices from a larger sheet. This specific example is an example of a manufacturing method that makes six display devices from one first sheet 110f and one second sheet 120f.

Figure 14A:
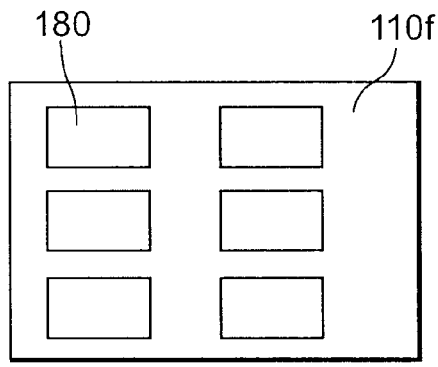
FIGS. 14A to 14D are schematic perspective views illustrating a portion of another method for manufacturing the display device according to the first embodiment of the invention.

First, as illustrated in FIG. 14A, the flexible first sheet 110f which forms the first substrate 110 and the flexible second sheet 120f which forms the second substrate 120 undergo a prescribed processing. The processing includes, for example, forming TFTs and various electrodes, and forming at least a portion of the display component 150.

Figure 14B:
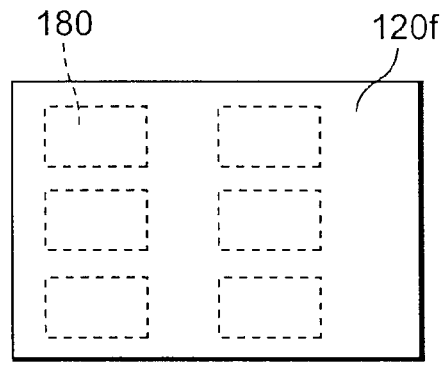

As illustrated in FIG. 14B, the first substrate 110 and the second substrate 120 are combined and disposed to face each other. At this time, the first substrate 110 and the second substrate 120 may be bonded by a bonding agent and the like, e.g., the bonding layer 181 provided in a region other than the display part 180. The bonding layer 181 may be provided on at least one of the first substrate 110 and the second substrate 120 prior to combining the first substrate 110 and the second substrate 120 to face each other.

Figure 14C:
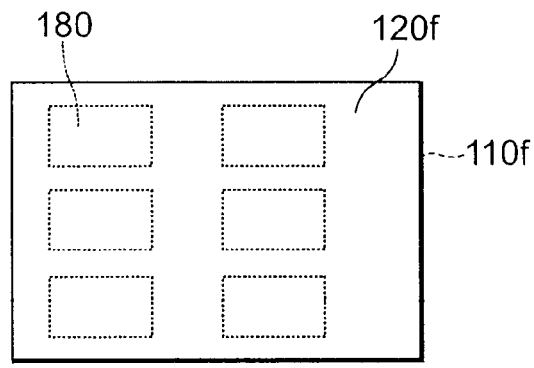
Figure 14D:
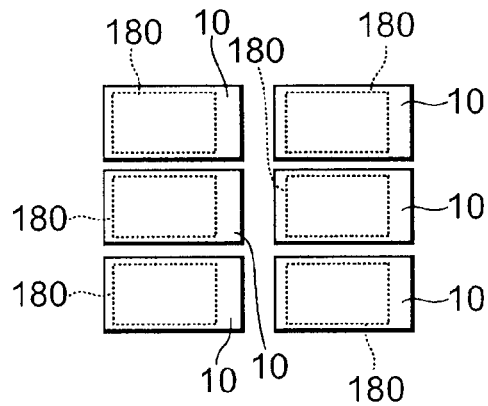

As illustrated in FIG. 14C, the first substrate 110 and the second substrate 120 are subdivided by cutting into six portions. As illustrated in FIG. 14D, for example, six display devices 10 are obtained. This state is the state illustrated in FIG. 13A.

Then, as illustrated in FIG. 13B, at least a portion of the wiring substrate 130 is inserted and fixed between the first substrate 110 and the second substrate 120 outside the display part 180.

Thus, in regard to manufacturing steps, it is advantageous that manufacturing the display devices by a method making multiple display devices from a larger sheet cuts the first and second sheets 110f and 120f, which form the first and second substrates 110 and 120, at the same position. Therefore, the end faces of the first and second substrates 110 and 120 are aligned at peripheral portions of the display device 10, and the connection pads 160 provided on at least one of the first and second substrates 110 and 120 are not exposed at the surface.

At this time, the wiring substrate 130 may be inserted between the first and second substrates 110 and 120 in a state in which at least one of the first and second substrates 110 and 120 is lifted upward or downward using a vacuum chuck, etc. In addition to such a method, a gap between the first and second substrates 110 and 120 may be increased by blowing a gas such as air between the end faces of the first and second substrates 110 and 120 and then inserting the wiring substrate 130 therebetween.

After inserting the wiring substrate 130 between the first and second substrates 110 and 120, the wiring substrate 130 may be fixed by a method using thermal compression bonding, pressurized compression bonding, pressurized thermal compression bonding, ultrasonic compression bonding, or various bonding agents or conductive resins; a method using a conductive resin and a bonding agent; a method using an anisotropic conducting film; or any of these methods alone or in combination, etc.

In the method illustrated in FIGS. 12A and 12B, the wiring substrate 130 is first bonded to the first substrate 110. Therefore, such a method cannot be easily applied to a method that makes multiple devices from a larger sheet such as that illustrated in FIGS. 14A to 14D. The method illustrated in FIGS. 13A and 13B, however, easily combines with a manufacturing method that makes multiple devices from a larger sheet and is advantageous in regard to production efficiency.

First Example

A display device 11 according to a first example of this embodiment is an active matrix-driven liquid crystal display device. The overall configuration is similar to the display device 10 illustrated in FIGS. 1 to 2B.

Namely, the display device 11 of the first example of the invention includes a flexible first substrate 110 and a flexible second substrate 120. The first substrate 110 is a TFT array substrate. The second substrate 120 is a counter substrate provided to face the TFT array substrate. A flexible printed circuit board is used as the wiring substrate 130.

There is provided: a seal (bonding layer) 181 which surrounds the display part 180 between the first substrate 110 and the second substrate 120; a liquid crystal layer (display component) 150 surrounded by the first substrate 110, the second substrate 120, and the bonding layer 181; connection pads 160 formed on the first substrate 110; and the wiring substrate 130 connected to the connection pads 160. A portion of the wiring substrate 130 is interposed between the first substrate 110 and the second substrate 120 in the connection region 190 outside the display part 180.

Figure 15A:
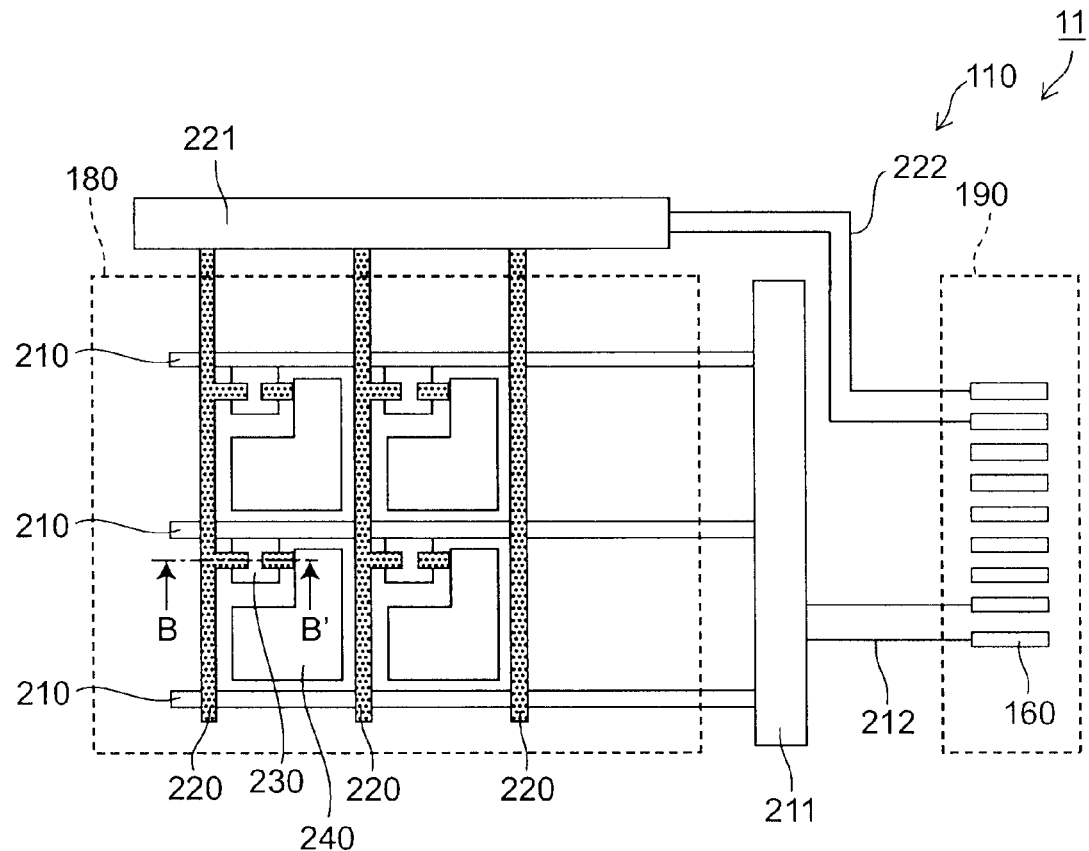
FIGS. 15A and 15B are schematic views illustrating the configuration of a substrate used in a display device according to the first example of the invention.
Figure 15B:
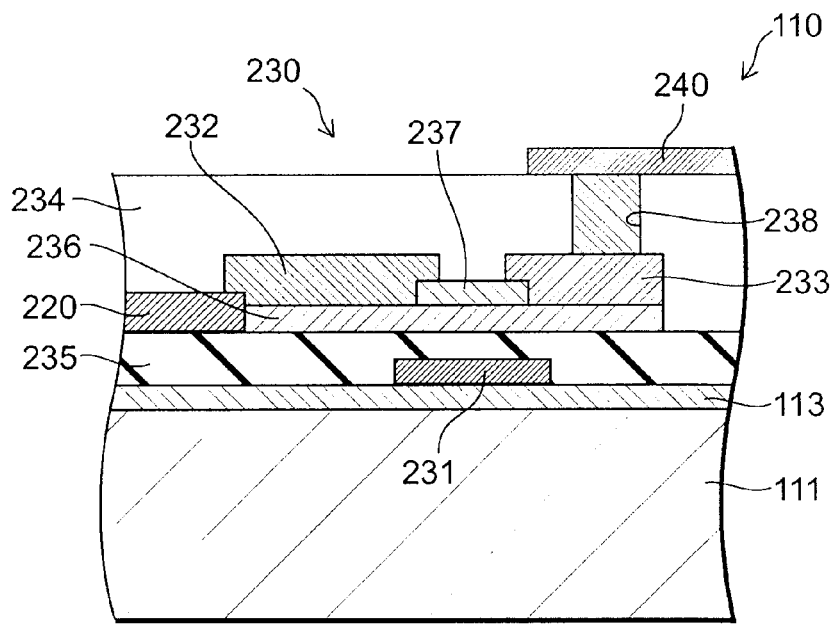

FIGS. 15A and 15B are schematic views illustrating the configuration of a substrate used in the display device according to the first example of the invention.

Namely, FIG. 15A is a schematic view illustrating pixel units and connection pads of the substrate, and FIG. 15B is a cross-sectional view along line B-B' of FIG. 15A.

As illustrated in FIG. 15A, multiple scanning lines 210, multiple signal lines 220 provided orthogonal to the scanning lines 210, TFTs 230 provided at each portion where the scanning lines 210 and the signal lines 220 intersect, and pixel electrodes 240 connecting to the TFTs 230 are provided on the first substrate 110. In other words, the display device is a matrix display device in which the pixel electrodes 240 are disposed in a matrix configuration. The region in which the pixel electrodes 240 are provided corresponds to the display part 180.

The connection region 190 is provided in a portion outside the display part 180. The connection pads 160 are provided in the connection region 190.

In this specific example, each of the scanning lines 210 connects to a scanning line circuit 211, and each of the signal lines 220 connects to a signal line circuit 221. The scanning line circuit 211 and the signal line circuit 221 connect to the connection pads 160 by wiring 212 and 222. However, at least one of the scanning line 210 and the signal line 220 may connect directly to the connection pad 160 without providing either of the scanning line circuit 211 and the signal line circuit 221.

In one pixel region illustrated in FIG. 15B, a gate electrode 231 of the TFT 230 connects to the scanning line 210, a source electrode 232 connects to the signal line 220, and a drain electrode 233 connects to the pixel electrode 240. The drain electrode 233 connects to a not-illustrated supplemental capacitance (storage capacitance). The supplemental capacitance connects to a not-illustrated supplemental capacitance line. The pixel electrode 240 is provided above the layer in which the TFT 230 is formed via a passivation 234. The scanning line 210, the signal line 220, the TFT 230, and the pixel electrode 240 are provided on a resin substrate 111. An undercoat layer 113 may be provided on the resin substrate 111.

An example of a method for forming the first substrate 110 will now be described.

First, a flexible substrate made of a transparent and highly heat-resistant member such as polyethersulfone, cyclic polyolefin, and the like is used as the resin substrate 111 forming the first substrate 110. As described above, the thickness thereof may be, for example, about 30 μm to 300 μm. For example, in the case where a sheet having a thickness of 100 μm or less is used, the steps that form the display device can be executed in a state in which the resin substrate 111 is fixed on a substrate made of, for example, glass and the like, which does not deform easily, using an adhesive, etc.

First, a single layer or stacked layers of inorganic films such as a silicon oxide film, a silicon nitride film, and a silicon oxynitride film is formed on the resin substrate 111 by plasma CVD (Chemical Vapor Deposition) and the like as the undercoat layer 113.

The scanning line 210 and the gate electrode 231 are formed on the undercoat layer 113. At this time, metal such as Mo, W, Ta, Al, and Ti, alloys thereof, or stacked films thereof may be used as the material of the scanning line 210 and the gate electrode 231. The scanning line 210 and the gate electrode 231 are formed by forming a film of the material recited above on the undercoat layer 113 by a method such as sputtering, then forming a pattern of a photoresist using photolithography, performing patterning by wet etching using acid and the like or by dry etching such as RIE (Reactive Ion Etching) with the photoresist as a mask.

Then, for example, a film forming a gate insulation film 235, a film forming a semiconductor layer 236, and a film forming a channel protection layer 237 are continuously formed using plasma CVD. A single layer or stacked layers of a silicon nitride film, a silicon oxide film, and a silicon oxynitride film may be used as the gate insulation film 235. A hydrogenated amorphous silicon film formed using a gas including silane and hydrogen as source-material gases may be used as the semiconductor layer 236. A silicon oxide film or a silicon nitride film may be used as the channel protection layer 237. At this time, the temperature of the resin substrate 111 during film formation may be controlled not to exceed the glass transition temperature of the resin substrate 111.

The channel protection layer 237 is formed by patterning using photolithography with wet etching by hydrofluoric acid and the like or dry etching such as RIE. After patterning the channel protection layer 237, plasma CVD is used to form an amorphous silicon layer doped with phosphorus (P) to make an ohmic contact. Then, metal such as Mo, W, Ta, Al, and Ti, alloys thereof, or stacked films thereof are formed by sputtering as a conducting film forming the source electrode 232, the drain electrode 233, and the signal line 220.

The conducting film recited above and the amorphous silicon layer therebelow are patterned by dry etching such as RIE similarly to the patterning of the gate electrode 231. After forming the source electrode 232 and the drain electrode 233, a silicon nitride film is formed by plasma CVD as the passivation 234, and a contact hole 238 for connecting to the drain electrode 233 is made by photolithography. The etching may be wet etching by hydrofluoric acid and the like or dry etching such as RIE. Then, a transparent electrode material such as ITO (Indium Tin Oxide) is formed by sputtering, and patterning is performed by photolithography to form the pixel electrode 240.

The connection pad 160 of the connection region 190 may be formed of, for example, the metal of the same layer as at least one of the scanning line 210 and the signal line 220. Also, wiring providing a connection from the scanning line 210 and the signal line 220 to the connection pad 160, via the scanning line circuit 211 and/or the signal line circuit 221 or not via the same, may use the metal of the same layer as at least one of the scanning line 210 and the signal line 220. A transparent electrode material, e.g., the same layer as the pixel electrode 240, may be provided on the upper face of the connection pad 160 to improve the contact.

In this example, a liquid crystal is used for the display component 150. Therefore, alignment processing is performed on the first substrate 110 for the molecular alignment of the liquid crystal. In other words, for example, a polyimide film is formed by printing on the display part 180 of the first substrate 110 as an alignment film, and rubbing processing is performed by rubbing with a cloth in a prescribed direction.

On the other hand, a substrate of the same material as the first substrate 110 may be used as the second substrate 120. Using substrates of the same material and the same thickness as the first and second substrates 110 and 120 provides a liquid crystal cell having a neutral surface at about the center of the first and second substrates 110 and 120, providing an advantage that cracks do not easily occur in the TFT 230, the wiring (such as the scanning line 210, the signal line 230, and the wiring to the connection pad 160), etc., during bending.

Heat treatment may be performed on at least one of the first and second substrates 110 and 120 to provide substantially the same thermal history, etc., to the first and second substrates 110 and 120.

A black matrix or a color filter layer may be formed on the second substrate 120 using printing or photolithography. Then, a transparent electrode is formed similarly to that of the first substrate 110 in a region to cover the display part 180. In other words, the transparent electrode of the second substrate 120 forms a counter electrode that faces the pixel electrodes 240 of the first substrate 110. The black matrix and the color filter layer may be provided on the first substrate 110.

The transparent electrode of the second substrate 120 may be provided not to jut exceedingly from the region of the seal to prevent shorts between the first substrate 110 and the second substrate 120.

A polyimide film is formed by printing also on the second substrate 120, and rubbing processing is performed by rubbing with a cloth in a prescribed direction.

After that, the first substrate 110 and the second substrate 120 are disposed to face each other across a spacing which is constant. To this end, spacers for keeping the spacing as a constant may be formed at this time on, for example, the first substrate 110. At this time, the spacers may be formed by spin-coating a photosensitive resin and forming a columnar structure by photolithography. Alternatively, spacers formed of an insulative material in spheres having a constant diameter may be dispersed on at least one of the first and second substrates 110 and 120.

A bonding agent forming the bonding layer 181 may be formed by screen printing, by a dispenser, etc., in the peripheral portion of the display part 180 on at least one of the first substrate 110 and the second substrate 120.

A prescribed amount of the liquid crystal is dropped on the inside of the bonding agent, and the first substrate 110 and the second substrate 120 are adhered together in a vacuum. When the positional alignment of the first substrate 110 and the second substrate 120 is completed, the bonding agent is cured by heating, UV irradiation, etc.

As another method, a bonding agent having a prescribed configuration may be provided on the first and second substrates 110 and 120. Subsequently, the bonding agent is cured and the first and second substrates 110 and 120 are bonded. Then, the liquid crystal is injected between the first and second substrates 110 and 120.

Then, polarizer may be adhered to each of the first and second substrates 110 and 120 if necessary to form each liquid crystal cell.

The steps described above can form one liquid crystal cell from one first substrate 110 and one second substrate 120, and can collectively form multiple liquid crystal cells from the first and second sheets 110*f* and 120*f* forming the first and second substrates 110 and 120 by the method that makes multiple devices from a larger sheet illustrated in FIGS. 14A to 14D.

In the case where the method that makes multiple devices from a larger sheet is used, the first and second substrates 110 and 120 are then cut to form each liquid crystal cell. At this time, the first and second substrates 110 and 120 and, if provided, the polarizer can be collectively cut using, for example, an infrared laser such as a $CO_2$ laser, an ultraviolet laser using a third harmonic or fourth harmonic YAG, etc.

The wiring substrate 130 (flexible printed circuit board) is mounted on each of the liquid crystal cells thus obtained. At this time, the connection pads 160 of the first substrate 110 are covered by the second substrate 120. Therefore, the flexible printed circuit board is mounted in a state in which a portion of the second substrate 120 is lifted using, for example, a vacuum chuck, etc.

An anisotropic conducting film, for example, may be used for the connection. For example, the anisotropic conducting film is temporarily attached to the connection face of the flexible printed circuit board toward the first substrate 110, and the flexible printed circuit board is stacked on the connection pads 160 of the first substrate 110. The second substrate 120 is disposed to cover the flexible printed circuit board, and a heated blade is pressed from above while performing positional alignment to perform thermal compression bonding.

At this time, in a structure in which the second substrate 120 is not provided on the flexible printed circuit board as in conventional (comparative) art, it was necessary to perform thermal compression bonding, for example, in a state in which a shock-absorbing material such as a plastic film was laid on the flexible printed circuit board to uniformly provide pressure and heat. Conversely, in the case of the display device 11 of this example, the second substrate 120 is disposed on the flexible printed circuit board. Therefore, the second substrate 120 performs the role of the shock-absorbing material, providing the advantage that the shock-absorbing material is unnecessary.

It is possible to simultaneously perform the connection of the first and second substrates 110 and 120 and the flexible printed circuit board by, for example, disposing a thermoset bonding agent between the second substrate 120 and the flexible printed circuit board during the compression bonding.

The flexible printed circuit board may be connected to, for example, a drive circuit and the like of the display device by a connector. A flexible backlight and the like, for example, may be disposed on the backside of the first substrate 110, and thereby, the flexible display device 11 according to this example is completed. The backlight may be omitted.

The first and second substrates 110 and 120 are mutually adhered by the bonding layer 181 and therefore deform as a single body when bent.

On the other hand, the flexible printed circuit board is formed of an opaque substrate such as, for example, polyimide and has a different Young's modulus than that of the array substrate and the counter substrate. Therefore, the bending amount is different under the same force during bending of the display device, and separation may occur between the flexible printed circuit board and the first substrate 110. However, in the display device 11 according to this example, the connection portion of the flexible printed circuit board is disposed between the first and second substrates 110 and 120, which act as a single body. Therefore, the flexible printed circuit board also behaves as a single body with the first and second substrates 110 and 120 on the connection pads 160. Therefore, separation does not easily occur.

Thus, the display device 11 according to this example suppressed separation of the connection portion.

The materials, structures, and formation methods of the first and second substrates 110 and 120, the wiring (the scanning line 210 and the signal line 220), the TFT 230, the pixel electrode 240, the connection pad 160, the bonding layer 181, and the display component 150 of the invention are not limited to the specific examples described above.

For example, although the TFT 230 is formed directly on a plastic substrate in this example, a TFT formed by transfer also may be used. In addition to amorphous silicon, polysilicon polycrystallized by laser annealing, an oxide semiconductor such as ZnO and the like or an organic semiconductor such as pentacene and the like may be used as the semiconductor material in the TFT 230. In the case where polysilicon is used as the semiconductor material, for example, a portion of a drive circuit of drivers and the like may be formed outside the display part 180 of the first substrate 110. In such a case, wiring connects the drive circuit of the drivers and the like to the connection pad 160.

The order of the steps described above is interchangeable, and steps may be performed simultaneously. For example, the order of the mounting step of the flexible printed circuit board, the cutting step of the first and second substrates, steps that adhere the polarizer, etc., is interchangeable.

Second Example

A display device 12 according to a second example of this embodiment is an active matrix-driven organic EL display device. The overall configuration is similar to that of the display device 10 illustrated in FIGS. 1 to 2B.

Namely, the display device 12 includes: a flexible first substrate 110; a flexible second substrate 120 provided to face the first substrate 110; a display part 180 provided on the flexible first substrate 110; and a wiring substrate 130 connected to a connection pad 160 provided on at least one of the first substrate 110 and the second substrate 120, at least a portion of the wiring substrate 130 being interposed between the first substrate 110 and the second substrate 120 outside the display part 180. A display component 150 to emit light is provided between the first substrate 110 and the second substrate 120 in the display part 180.

Thus, the display device 12 according to this example is an example in which the display component 150 emits light and an organic EL is used in the display component 150.

An array substrate is used as the first substrate 110, and a sealing substrate is used as the second substrate 120.

A method similar to the method performed for the first substrate 110 in the first example may be used as the method for forming the TFT 230 on the first substrate 110.

In this case, birefringent materials such as PET, PEN, and the like may be used as the first substrate 110 in addition to the substrate described in the first example. By using a top-emission structure, an opaque or colored plastic substrate, metal substrate such as SUS (stainless steel), etc., also may be used.

Figure 16A:
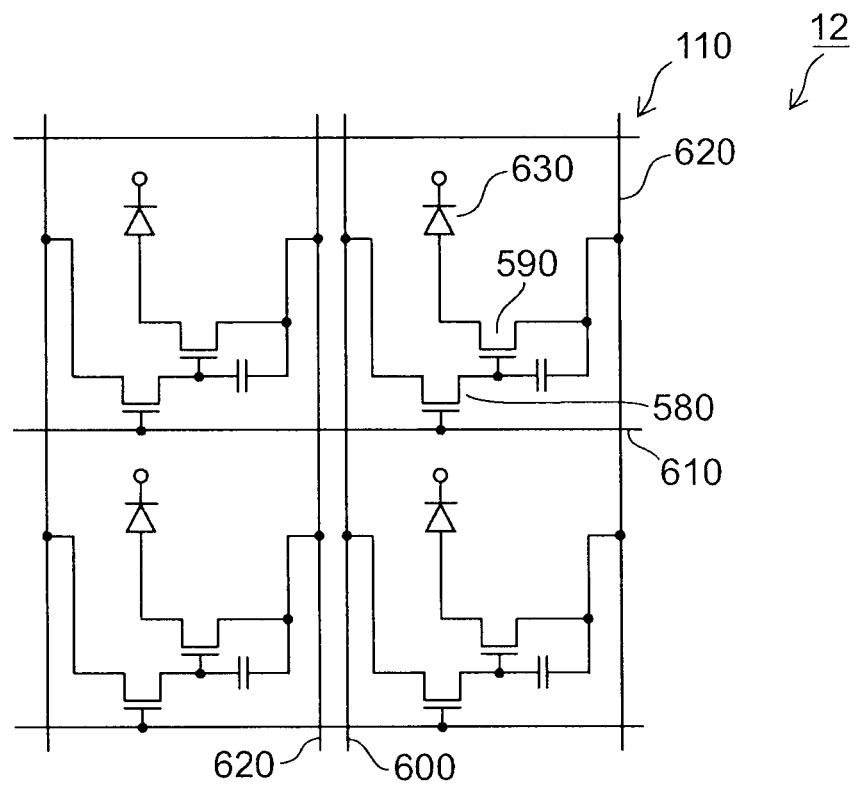
FIGS. 16A and 16B are schematic views illustrating the configuration of pixel units of the substrate used in a display device according to the second example of the invention.
Figure 16B:
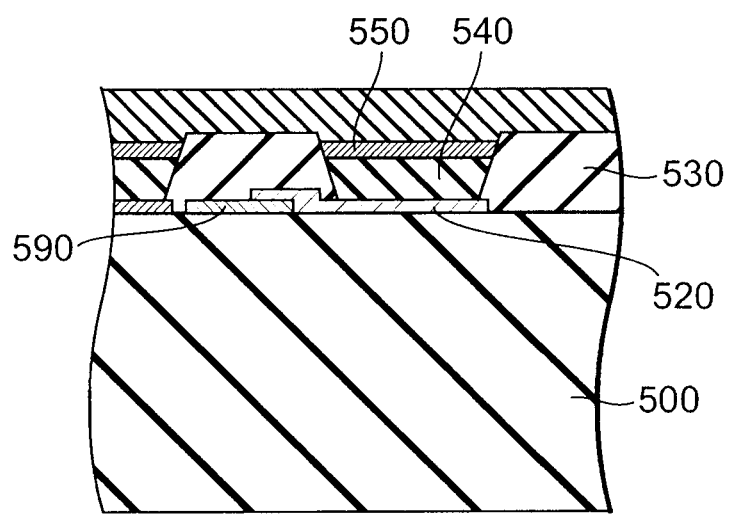

FIGS. 16a and 16b are schematic views illustrating the configuration of pixel units of the substrate used in the display device according to the second example of the invention.

Namely, FIG. 16A is a schematic view illustrating pixel units of the substrate, and FIG. 16B is a cross-sectional view along line C-C' of FIG. 16A.

As illustrated in the structure of FIG. 16A, multiple scanning lines 610, multiple signal lines 600 provided orthogonal to the scanning lines 610, first TFTs 580 provided at each portion where the scanning lines 610 and the signal lines 600 intersect, and second TFTs 590 connected to a power supply line 620 and the first TFTs 580 are provided on the first substrate 110. An anode 520 connected to the second TFT 590 provides current to an organic EL layer 630.

In the pixel of the first substrate 110 illustrated in FIG. 16B, the anode 520 is provided instead of the pixel electrode of the first example. ITO and the like may be used as the material of the anode 520. A reflecting electrode formed by stacking ITO, Ag, and ITO in order may be used in the case where a top-emission structure is used.

A hole injection layer, a hole transport layer, a light emitting layer 540, an electron transport layer, an electron injection layer, and a cathode 550 are provided by vacuum vapor deposition and the like on the anode 520. Disposing of the light emitting layer can be realized by a method such as masked vapor deposition, and bumps 530 may be formed of a photosensitive resin and the like if necessary.

After forming the cathode 550, the first and second substrates 110 and 120 are adhered to each other by a seal formed around the display part 180 in a dry atmosphere. A desiccant may be inserted between the first and second substrates 110 and 120 to prevent deterioration of the organic EL element due to water.

By adhering a circular polarizer to the second substrate 120, it is possible to prevent degradation of the image quality due to reflected light. In such a case, the polarizer may be adhered prior to the cut-out step, and the cut-out can be performed collectively by a laser and the like. Therefore, steps that adhere the polarizer can be simplified.

The display device 12 according to this example having such a structure also can suppress separation of the connection portion.

Second Embodiment

A method for manufacturing a display device according to a second embodiment of the invention is a method for manufacturing a display device including: a flexible first substrate 110; a flexible second substrate 120 provided to face the first substrate 110; a display part 180 having a display component 150 disposed between the first substrate 110 and the second substrate 120 to produce at least one of an optical characteristic change and a light emission; and a wiring substrate 130 connected to a connection pad 160 provided on at least one of the first substrate 110 and the second substrate 120. The assembly of the first and second substrates 110 and 120 and the wiring substrate 130 is distinctive and therefore will be described.

Figure 17:
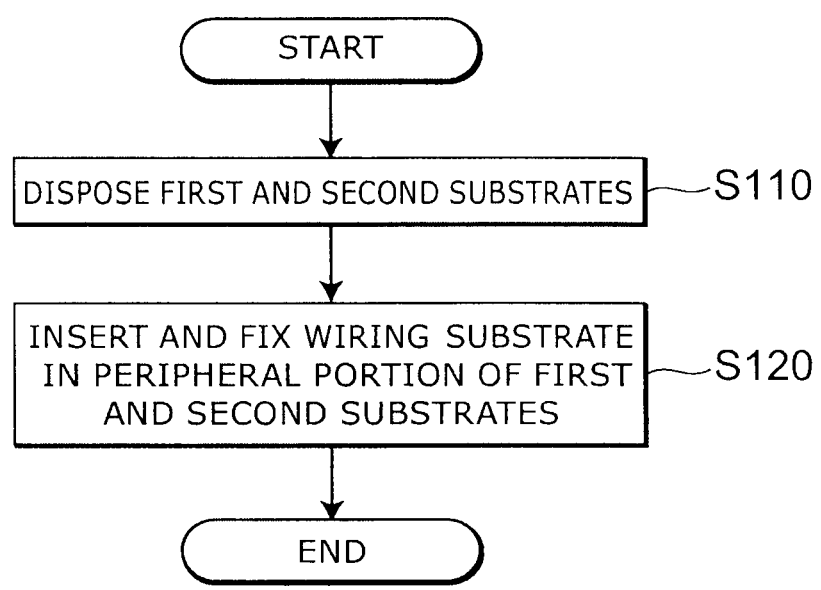
FIG. 17 is a flowchart illustrating a method for manufacturing the display device according to the second embodiment of the invention.

FIG. 17 is a flowchart illustrating the method for manufacturing the display device according to the second embodiment of the invention.

In the method for manufacturing the display device according to this embodiment illustrated in FIG. 17, first, the display component 150 is disposed in the display part 180 between the first and second substrates 110 and 120, and the first substrate 110 and the second substrate 120 are disposed to face each other (step S110).

At least a portion of the wiring substrate 130 is inserted between the first substrate 110 and the second substrate 120 outside the display part 180. The wiring substrate 130 is fixed to at least one of the first substrate 110 and the second substrate 120 (step S120).

In step S110 recited above, the order of disposing the display component 150 in the display part 180 between the first and second substrates 110 and 120 and disposing the first substrate 110 and the second substrate 120 is arbitrary.

In other words, as described above, the bonding agent is provided in a prescribed configuration on the first and second substrates 110 and 120, a prescribed amount of the liquid crystal is dropped on the inside of the bonding agent, and then the first substrate 110 and the second substrate 120 are adhered to each other in a vacuum to dispose the first substrate 110 and the second substrate 120 to face each other. At this time, the first substrate 110 and the second substrate 120 can be bonded. Alternatively, a bonding agent having a prescribed configuration may be provided on the first and second substrates 110 and 120. Subsequently, the bonding agent may be cured to dispose the first and second substrates 110 and 120 facing each other. Then, the liquid crystal may be injected between the first and second substrates 110 and 120.

An organic EL layer, i.e., the display component 150, may be provided in, for example, the display part 180 of the first substrate 110 in the case where the display component 150 is, for example, an organic EL element. Then, the first substrate 110 and the second substrate 120 can be disposed facing each other.

Although the first and second substrates 110 and 120 are disposed facing each other in step S110, the first and second substrates 110 and 120 may be bonded at this time. The bond of the first and second substrates 110 and 120 may be performed in step S120 or after step S120.

When inserting at least a portion of the wiring substrate 130 between the first substrate 110 and the second substrate 120 in step S120, at least a portion of the wiring substrate 130 may be inserted between the first and second substrates 110 and 120 in a state in which at least one of the first and second substrates 110 and 120 is lifted upward or downward using, for example, a vacuum chuck, etc., to increase the spacing between the first and second substrates 110 and 120.

The wiring substrate 130 is fixed on at least one of the first substrate 110 and the second substrate 120.

The method for manufacturing the display device recited above may use a method that makes multiple devices from a larger sheet as that illustrated in FIGS. 14A to 14D, or may use a method that makes a single device.

In the case where the method that makes multiple devices from a larger sheet is used, as described above, the first and second substrates 110 and 120 can be collectively cut. At this time, the end faces of the first and second substrates 110 and 120 can be cut in substantially the same plane.

Thus, the method for manufacturing the display device according to this embodiment may further include a step that collectively cuts at least a portion of the substrate forming the first substrate 110 (for example, the first sheet 110*f*) and the substrate forming the second substrate 120 (for example, the second sheet 120*f*) between step S110 and step S120.

The step that collectively cuts at least a portion of the substrate forming the first substrate 110 and the substrate forming the second substrate 120 may be a step that cuts the substrate forming the first substrate 110 and the substrate forming the second substrate 120 such that the end faces of at least portions of the first substrate 110 and the second substrate 120 form substantially the same plane.

Such a method for manufacturing the display device according to this embodiment can suppress separation of the connection portion.

As described above, the method for manufacturing the display device according to this embodiment provides an advantage that a shock-absorbing material is unnecessary during thermal compression bonding of the wiring substrate 130 to at least one of the first and second substrates 110 and 120.

Hereinabove, embodiments of the invention are described with reference to specific examples. However, the invention is not limited to these specific examples. For example, one skilled in the art may appropriately select specific configurations of components of the display device and the method for manufacturing the same from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all display devices and methods for manufacturing the same that can be obtained by an appropriate design modification by one skilled in the art based on the display devices and the methods for manufacturing the same described above as embodiments of the invention also are within the scope of the invention to the extent that the purport of the invention is included.

Furthermore, various modifications and alterations within the spirit of the invention will be apparent to those skilled in the art. All such modifications and alterations should therefore be seen as within the scope of the invention.

The invention claimed is:

1. A display device comprising:
a flexible first substrate including a display region and a connection region provided outside of the display region, a connection pad being provided on the first substrate in the connection region;
a flexible second substrate provided facing the first substrate;
the display region including a display component disposed between the second substrate and the display region of the first substrate, the display component configured to produce at least one of an optical characteristic change or a light emission;
a wiring substrate, at least a portion of the wiring substrate being interposed between the second substrate and the connection region of the first substrate outside of the display region, the portion of the wiring substrate being bonded with the connection region of the first substrate, and the connection pad extending between the first substrate and the wiring substrate such that the first substrate and the wiring substrate are directly connected to the connection pad on opposite sides of the connection pad;
a first bonding layer bonding the first substrate and the second substrate outside the display region; and
a second bonding layer provided between the portion of the wiring substrate and the second substrate to bond directly the portion of the wiring substrate and the second substrate, the second bonding layer extending only on a side of the wiring substrate facing the second substrate,
the second substrate having an inner face facing a side of the first substrate and an outer face facing opposite to the inner face,
the inner face including a first edge on a side of the wiring substrate,
the outer face including a second edge on a side of the wiring substrate, and
the portion of the wiring substrate being between the first edge and the first substrate and between the second edge and the first substrate, and
wherein the wiring substrate includes a protrusion and at least a portion of the protrusion is buried in at least one of the first and second substrates.

2. The device according to claim 1, wherein a polarizer is adhered to at least one of the first and second substrates.

3. The device according to claim 1, wherein at least one of the first substrate and the second substrate is transparent.

4. The device according to claim 1, wherein at least one of the first substrate and the second substrate includes at least one selected from the group consisting of polyethersulfone, cyclic polyolefin, polyethylene terephthalate, and polyethylene naphthalate.

5. The device according to claim 1, wherein the wiring substrate includes at least one selected from the group consisting of polyimide, polyester, and epoxy resin.

6. The device according to claim 1, wherein the wiring substrate performs, on the first substrate and the second substrate, at least one of an electrical signal input, an electrical signal output, a power supply current input, and a power supply current output.

7. The device according to claim 1, wherein the wiring substrate includes a wiring on a face on the first substrate side.

8. The device according to claim 1, further comprising
an insulative separation layer provided between the first substrate and the second substrate,
the display component including a first component provided between the first substrate and the separation layer, and a second component provided between the second substrate and the separation layer.

9. The device according to claim 1, wherein the first substrate includes a plurality of thin film transistors disposed in a matrix configuration, and a pixel electrode connected to the plurality of thin film transistors.

10. The device according to claim 1, wherein the first substrate includes a plurality of band-shaped first electrodes aligned in a first direction, and the second substrate includes a plurality of band-shaped second electrodes aligned in a direction intersecting the first direction.

11. The device according to claim 1, wherein the display component includes a layer where at least one of a refractive index, optical activity, scattering property and absorptance changes based on a provided electrical signal.

12. The device according to claim 1, wherein the display component includes a liquid crystal.

13. The device according to claim 1, wherein the display component includes an organic EL.

14. The device according to claim 1, wherein multiple connection pads are provided on the first substrate, and
multiple protrusions are provided at a surface of the wiring substrate to face the first substrate so as to be sunk between each of the multiple connection pads.

15. The device according to claim 14, wherein each protrusion is provided at a surface of the wiring substrate to face the second substrate and is buried in the second substrate.

16. The device according to claim 1, wherein the second bonding layer includes non-conductive regions.

17. The device according to claim 1, further comprising a conducting film to connect the wiring substrate to the connection pad.

18. The device according to claim 1, wherein
a first position of the first edge in a direction from the display region toward the connection region is positioned at a second position of the second edge in the direction from the display region toward the connection region.

* * * * *